United States Patent
Takinami et al.

(10) Patent No.: US 7,321,271 B2
(45) Date of Patent: Jan. 22, 2008

(54) VOLTAGE-CONTROLLED OSCILLATOR, RADIO COMMUNICATION APPARATUS AND VOLTAGE-CONTROLLED OSCILLATION METHOD FOR REDUCING DEGRADATION OF PHASE NOISE CHARACTERISTIC

(75) Inventors: Koji Takinami, Osaka (JP); Hisashi Adachi, Osaka (JP); Tokio Endoh, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 66 days.

(21) Appl. No.: 10/676,654

(22) Filed: Oct. 1, 2003

(65) Prior Publication Data

US 2005/0190002 A1 Sep. 1, 2005

(30) Foreign Application Priority Data

Oct. 3, 2002 (JP) ............................. 2002-291632

(51) Int. Cl.
*H03B 5/18* (2006.01)
(52) U.S. Cl. ............................. 331/117 R; 331/177 V; 331/179
(58) Field of Classification Search ............ 331/117 R, 331/36 C, 177 V, 179, 117 FE
See application file for complete search history.

(56) References Cited

U.S. PATENT DOCUMENTS

| | | | |
|---|---|---|---|
| 6,292,065 B1 * | 9/2001 | Friedman et al. | 331/117 R |
| 6,509,805 B2 * | 1/2003 | Ochiai | 331/117 FE |
| 6,621,364 B2 * | 9/2003 | Grewing et al. | 331/177 V |
| 6,774,736 B1 * | 8/2004 | Kwek et al. | 331/177 V |
| 6,833,769 B2 * | 12/2004 | Seppinen et al. | 331/177 V |
| 6,995,626 B2 | 2/2006 | Oehm et al. | |
| 2001/0050598 A1 * | 12/2001 | Mourant et al. | 331/117 R |

FOREIGN PATENT DOCUMENTS

JP 2001-352218 12/2001

OTHER PUBLICATIONS

B. Razavi, "Prospects of CMOS Technology-for High-Speed Optical Communication Circuits", IEEE Journal of Solid-State Circuit, vol. 37, No. 9, Sep. 2002, pp. 1135-1144).
Jürgen Oehm, Duyen Pham-Stäbner, Linear Controlled Temperature Independent Varactor Circuitry, ESSCIRC 2000, Session C06-VCO and Resonator Techniques, Sep. 24, 2002, pp. 143-146.
Pietro Andreani and Sven Mattisson, on the use of MOS Varactors in RF VCO's, IEEE Journal of Solid-State Circuits, vol. 35, No. 6, Jun. 2000, pp. 905-910.

* cited by examiner

*Primary Examiner*—Joseph Chang
(74) *Attorney, Agent, or Firm*—RatnerPrestia

(57) ABSTRACT

A voltage-controlled oscillator having an inductor circuit, n pieces (n is two or more) of variable capacitance circuit having variable capacitance elements, negative resistance circuits, and reference voltage generation means of generating a reference voltage from a power supply voltage, and wherein a predetermined reference voltage is inputted to some terminals of the variable capacitance elements of the n pieces of variable capacitance circuit, a control voltage is inputted to the other terminals thereof, and of the variable capacitance elements of the n pieces of variable capacitance circuits, the predetermined reference voltage inputted to some terminals of the variable capacitance elements of at least two pieces of the variable capacitance circuit is different.

6 Claims, 22 Drawing Sheets

Fig. 13 (a)  PRIOR ART
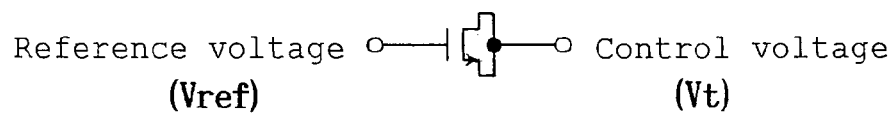
Fig. 13 (b)  PRIOR ART
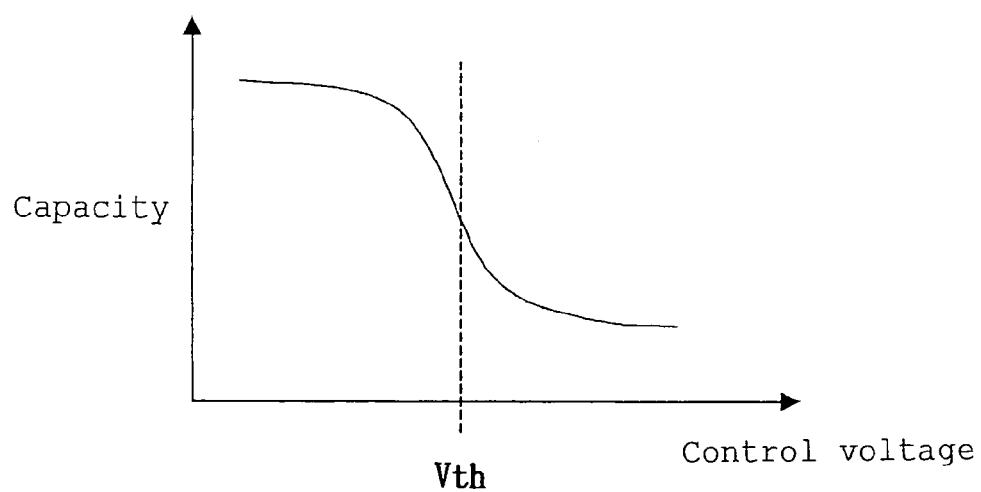

VOLTAGE-CONTROLLED OSCILLATOR, RADIO COMMUNICATION APPARATUS AND VOLTAGE-CONTROLLED OSCILLATION METHOD FOR REDUCING DEGRADATION OF PHASE NOISE CHARACTERISTIC

BACKGROUND OF THE INVENTION

1. Field of the Invention

The present invention relates to a voltage-controlled oscillator used for a radio communication device, a radio communication apparatus using the voltage-controlled oscillator and a voltage-controlled oscillation method.

2. Related Art of the Invention

A voltage-controlled oscillator is widely used as a means of generating a local oscillation signal of a radio communication device.

FIG. 12 shows an example of a prior art configuration of such a voltage-controlled oscillator.

In FIG. 12, reference numerals 1a and 1b denote oscillation transistors, 2a and 2b denote inductors, and 3a and 3b denote variable capacitance elements. Reference numeral 4 denotes a power supply terminal, 5 denotes a frequency control terminal, and 6 denotes a current source. A bias circuit and other elements are omitted in FIG. 12.

In FIG. 12, the inductors 2a and 2b and variable capacitance elements 3a and 3b constitute a parallel resonant circuit. As a capacitance value of the variable capacitance element changes due to a difference in voltages at both ends thereof, the capacitance values of the variable capacitance elements 3a and 3b change due to a control voltage applied to the frequency control terminal 5, and consequently a resonance frequency of the parallel resonant circuit changes.

As an oscillation frequency of the voltage-controlled oscillator oscillates in the neighborhood of the resonance frequency of the resonant circuit, it is possible, by adjusting the control voltage, to control the oscillation frequency of the voltage-controlled oscillator to be a desired frequency. The oscillation transistors 1a and 1b are intended to generate negative resistance and cancel losses due to a parasitic resistance component of the resonant circuit so as to satisfy an oscillation requirement.

A relationship between the control voltage and the oscillation frequency of the voltage-controlled oscillator is virtually determined by a characteristic of the variable capacitance element. It is desirable that the variable capacitance element changes the capacitance slowly in a wide range of the control voltage. It is because, in the case of a PLL (phase lock loop) by using the voltage-controlled oscillator, a transient response characteristic and a noise band characteristic of a PLL circuit depend on frequency sensitivity with respect to the control voltage. Therefore, if the frequency sensitivity is different according to the frequency, the characteristic of the PLL circuit itself changes according to the frequency. In an area where the frequency sensitivity with respect to the control voltage is high, there is a problem that a phase noise characteristic is degraded because the frequency changes due to slight noise caused on a frequency control terminal.

In reality, however, it is difficult to utilize the variable capacitance element of high linearity. The reason for this is that when the voltage-controlled oscillator is formed on a semiconductor substrate, costs increase because of a special process needed to form the variable capacitance element. FIG. 13(a) shows the variable capacitance element utilizing a gate capacitance widely used in a CMOS process, and FIG. 13(b) shows the variation of the gate capacitance in the case of applying the reference voltage to the gate of a MOS transistor and applying the control voltage to a drain-source side. Thus, in the case of the variable capacitance element utilizing the gate capacitance of the MOS transistor generally used, the capacitance value abruptly changes in the neighborhood of a threshold voltage (Vth in the drawing). Thus, the oscillation frequency also abruptly changes in the neighborhood of a threshold. Consequently, there arises a problem that the transient response characteristic and noise band characteristic of the PLL circuit using this VCO significantly change depending on the frequency.

The circuit described below has already been proposed in order to solve such problems.

FIG. 14 is a circuit showing a technique of improving the linearity of the variable capacitance element (refer to Japanese Patent Laid-Open No. 2001-352218 for instance). In FIG. 14, the same portions as those previously described are given the same symbols and a description thereof will be omitted.

Reference numerals 10a, 10b, 11a, 11b, 12a and 12b denote the variable capacitance elements, and 13 denotes a level shift circuit. A control signal inputted from the frequency control terminal 5 is inputted to the level shift circuit 13, and voltages having shifted by Vd such as Vt, Vt−Vd and Vt−2Vd are outputted from three output terminals outputted from the above described level shift circuit. In this case, the characteristics of the variable capacitance elements (10a to 12b) against the control voltage Vt are the characteristics shifted by Vd as shown in FIG. 15. As the capacitance of the resonant circuit is a total of these six capacities, a total capacitance thereof is the characteristic indicated by a dashed line in FIG. 15 (A in FIG. 15) so that the change in the capacitance against the control voltage can be moderate.

In the above method, the level shift circuit 13 is constituted by using the transistors such as FET as shown in FIG. 22. This is because the level shift circuit 13 requires high input impedance in order to hold a DC voltage inputted from the frequency control terminal 5.

According to the above method, it is possible to improve the phase noise characteristic of the control signal, but it is not possible to curb the variation or the noise in the power supply voltage. To be more specific, a difference voltage between the power supply voltage and the control signal is applied to both ends of the variable capacitance elements 10a, 10b, 11a, 11b, 12a and 12b, and so they are influenced by the variation or the noise in the power supply voltage even if the noise on the control signal side is curbed. Therefore, the voltage-controlled oscillator changes its oscillation frequency due to the influence of minute variation or the noise in the power supply voltage.

As a countermeasure, there has been proposed a configuration wherein one voltage applied to each variable capacitance element is not the power supply voltage, and each variable capacitance element is interrupted from the power supply voltage with a blocking capacitor so as to supply the reference voltage different from the power supply voltage (refer to "Prospects of CMOS Technology for High-Speed Optical Communication Circuits" by Behzad Razavi, IEEE Journal of Solid-State Circuit, vol. 37, No. 9 September 2002, pp. 1135–1144 for instance).

SUMMARY OF THE INVENTION

According to the above method, however, a reference voltage is generated by directly utilizing for example, a resistance-divided power supply voltage so that the reference voltage is influenced by variation or noise in the power supply voltage after all.

A configuration of level-shifting a control voltage has a problem that a phase noise characteristic is degraded due to the noise generated from a transistor such as FET.

In consideration of the above problems, an object of the present invention is to provide a voltage-controlled oscillator capable of curbing influence of the variation or the noise in the power supply voltage, a radio communication apparatus using the voltage-controlled oscillator and a voltage-controlled oscillation method, or to provide the voltage-controlled oscillator, radio communication apparatus and voltage-controlled oscillation method capable of curbing degradation of the phase noise characteristic of a control signal and/or the power supply voltage.

The $1^{st}$ aspect of the present invention is a voltage-controlled oscillator having:

an inductor circuit having an inductor;

n pieces (n is two or more) of variable capacitance circuit having a variable capacitance element and having blocking capacitors of interrupting a direct current at both ends thereof, a negative resistance circuit, and reference voltage generation means of generating a reference voltage from a power supply voltage, and wherein:

said inductor circuit, said n pieces of variable capacitance circuit and said negative resistance circuit are connected in parallel;

a predetermined reference voltage is inputted to some terminals of the variable capacitance elements of said n pieces of variable capacitance circuit;

a control voltage of feedback-controlling an oscillation frequency is inputted to the other terminals of the variable capacitance elements of said n pieces of variable capacitance circuits; and of said n pieces of variable capacitance circuits, the predetermined reference voltage inputted to one of the terminals of the variable capacitance elements of at least two of said n pieces of variable capacitance circuit is different.

The $2^{nd}$ aspect of the present invention is the voltage-controlled oscillator according to the $1^{st}$ aspect of the present invention, wherein, when said n pieces of variable capacitance circuits are arranged in decreasing order of reference voltages inputted to said n pieces of variable capacitance circuits, a difference between the voltage inputted to one terminal of the variable capacitance element of an m-th (m is between 2 and n) variable capacitance circuit and the voltage inputted to one terminal of the variable capacitance element of an m−1-th variable capacitance circuit is Vd.

The $3^{rd}$ aspect of the present invention is the voltage-controlled oscillator according to the $1^{st}$ aspect of the present invention, wherein said reference voltage generation means has series-connected n+1 pieces of resistor, and said n pieces of reference voltage are generated by having said power supply voltage divided by said series-connected n+1 pieces of resistor.

The $4^{th}$ aspect of the present invention is the voltage-controlled oscillator according to the $1^{st}$ aspect of the present invention, wherein said reference voltage generation means has series-connected one resistor and n pieces of diode, and said n pieces of reference voltage are generated by having said power supply voltage divided by said series-connected one resistance and n pieces of diode.

The $5^{th}$ aspect of the present invention is the voltage-controlled oscillator according to the $4^{th}$ aspect of the present invention, wherein said diodes are formed by transistors having bases and collectors thereof shorted.

The $6^{th}$ aspect of the present invention is the voltage-controlled oscillator according to the $3^{rd}$ aspect of the present invention, wherein said reference voltage generation means further has an active filter.

The $7^{th}$ aspect of the present invention is the voltage-controlled oscillator according to the $1^{st}$ aspect of the present invention, wherein said reference voltage generation means has series-connected one active filter and n pieces of resistors, and said n pieces of reference voltage are generated by having said power supply voltage divided by said series-connected one active filter and n pieces of resistors.

The $8^{th}$ aspect of the present invention is the voltage-controlled oscillator according to the $1^{st}$ aspect of the present invention, wherein output sides of outputting said reference voltages of said reference voltage generation means are grounded via capacitive elements respectively.

The $9^{th}$ aspect of the present invention is the voltage-controlled oscillator according to the $1^{st}$ aspect of the present invention, further having connected in parallel thereto a frequency band setting variable capacitance circuit having a variable capacitance element, having a power supply voltage inputted to one terminal of said variable capacitance element and having a voltage according to a frequency band to be used of a plurality of voltages inputted to the other terminal of said variable capacitance element so as to change a capacitance of said variable capacitance element, wherein, when the capacitance of the variable capacitance element of said first variable capacitance circuit becomes less than a predetermined value, a variable range is reduced as to the capacitance of at least one variable capacitance circuit of said n pieces of variable capacitance circuit.

The $10^{th}$ aspect of the present invention is the voltage-controlled oscillator according to the $9^{th}$ aspect of the present invention, wherein at least one variable capacitance circuit of said n pieces of variable capacitance circuit has the variable capacitance element connected in parallel to said variable capacitance element, and the voltage according to a frequency to be used of said plurality of voltages is inputted to the other terminal of one of said variable capacitance elements instead of said control voltage so that the variable range is reduced as to the capacitance of at least one variable capacitance circuit of said n pieces of variable capacitance circuit according to the reduction in the capacitance of the variable capacitance element of said frequency band setting variable capacitance circuit.

The $11^{th}$ aspect of the present invention is the voltage-controlled oscillator according to the $9^{th}$ aspect of the present invention, wherein said blocking capacitor is comprised of two or more capacitors connected via a switch, and said switch is off or on according to the frequency to be used so that the capacitance of said blocking capacitors is reduced and a variable range of the capacitance of at least one of said n pieces of variable capacitance circuit is reduced.

The $12^{th}$ aspect of the present invention is the voltage-controlled oscillator according to the $1^{st}$ aspect of the present invention, wherein said variable capacitance element operates by utilizing a gate capacitance of an MOS transistor.

The $13^{th}$ aspect of the present invention is a voltage-controlled oscillator having:

an inductor circuit having an inductor;

n pieces (n is two or more) of variable capacitance circuit having a variable capacitance element, and a negative resistance circuit, and wherein:

said inductor circuit, said n pieces of variable capacitance circuit and said negative resistance circuit are connected in parallel, and a control voltage of feedback-controlling an oscillation frequency is inputted to some terminals of the variable capacitance elements of said n pieces of variable capacitance circuit; and of said n pieces of variable capacitance circuits, capacitance variation characteristics against voltage of the variable capacitance elements of at least two thereof are different.

The 14$^{th}$ aspect of the present invention is the voltage-controlled oscillator according to the 13$^{th}$ aspect of the present invention, wherein said variable capacitance elements of which capacitance variation characteristics are different against the voltage are implemented by MOS capacitance of different impurity concentrations.

The 15$^{th}$ aspect of the present invention is the voltage-controlled oscillator according to the 13$^{th}$ aspect of the present invention, wherein said variable capacitance elements of which capacitance variation characteristics are different against the voltage are implemented by the MOS capacitance utilizing a p-channel MOS and the MOS capacitance utilizing an n-channel MOS.

The 16$^{th}$ aspect of the present invention is the voltage-controlled oscillator according to the 13$^{th}$ aspect of the present invention, wherein said variable capacitance elements of which capacitance variation characteristics are different against the voltage are implemented by the MOS capacitance of which terminals are a gate and a drain-source and the MOS capacitance of which terminals are the gate and a well.

The 17$^{th}$ aspect of the present invention is a radio communication apparatus having a PLL circuit of outputting a signal of a target frequency having the voltage-controlled oscillator according to the 1$^{st}$ or the 13$^{th}$ aspect of the present invention.

The 18$^{th}$ aspect of the present invention is a voltage-controlled oscillation method of a voltage-controlled oscillator having:

an inductor circuit having an inductor;

n pieces (n is two or more) of variable capacitance circuit having a variable capacitance element and having blocking capacitors of interrupting a direct current at both ends thereof, a negative resistance circuit, and reference voltage generation means of generating a reference voltage from a power supply voltage, with said inductor circuit, said n pieces of variable capacitance circuit and said negative resistance circuit connected in parallel, and wherein there are:

a step of inputting a predetermined reference voltage to some terminals of the variable capacitance elements of said n pieces of variable capacitance circuit; and a step of inputting a control voltage of feedback-controlling an oscillation frequency to the other terminals of the variable capacitance elements of said n pieces of variable capacitance circuits, and the predetermined reference voltage inputted to one of the terminals of the variable capacitance elements of at least two of said n pieces of variable capacitance circuit is different.

According to the present invention, it is possible to provide the voltage-controlled oscillator capable of curbing influence of the variation or the noise in the power supply voltage, the radio communication apparatus and the voltage-controlled oscillation method using the voltage-controlled oscillator, or to provide the voltage-controlled oscillator, radio communication apparatus and voltage-controlled oscillation method capable of curbing the degradation of the phase noise characteristic.

BRIEF DESCRIPTION OF THE DRAWINGS

FIG. 2($b$) is a diagram for explaining a principle of operation of the voltage-controlled oscillator according to the first embodiment of the present invention;

FIG. 10($b$) is a diagram for explaining a principle of the voltage-controlled oscillator according to the second embodiment of the present invention;

FIG. 13($a$) is diagram showing a variable capacitance element utilizing a gate capacitance widely used in a CMOS process;

FIG. 13($b$) is a diagram showing change in a capacitance value against a control voltage of a MOS capacitance;

DESCRIPTION OF SYMBOLS

Figure 1:
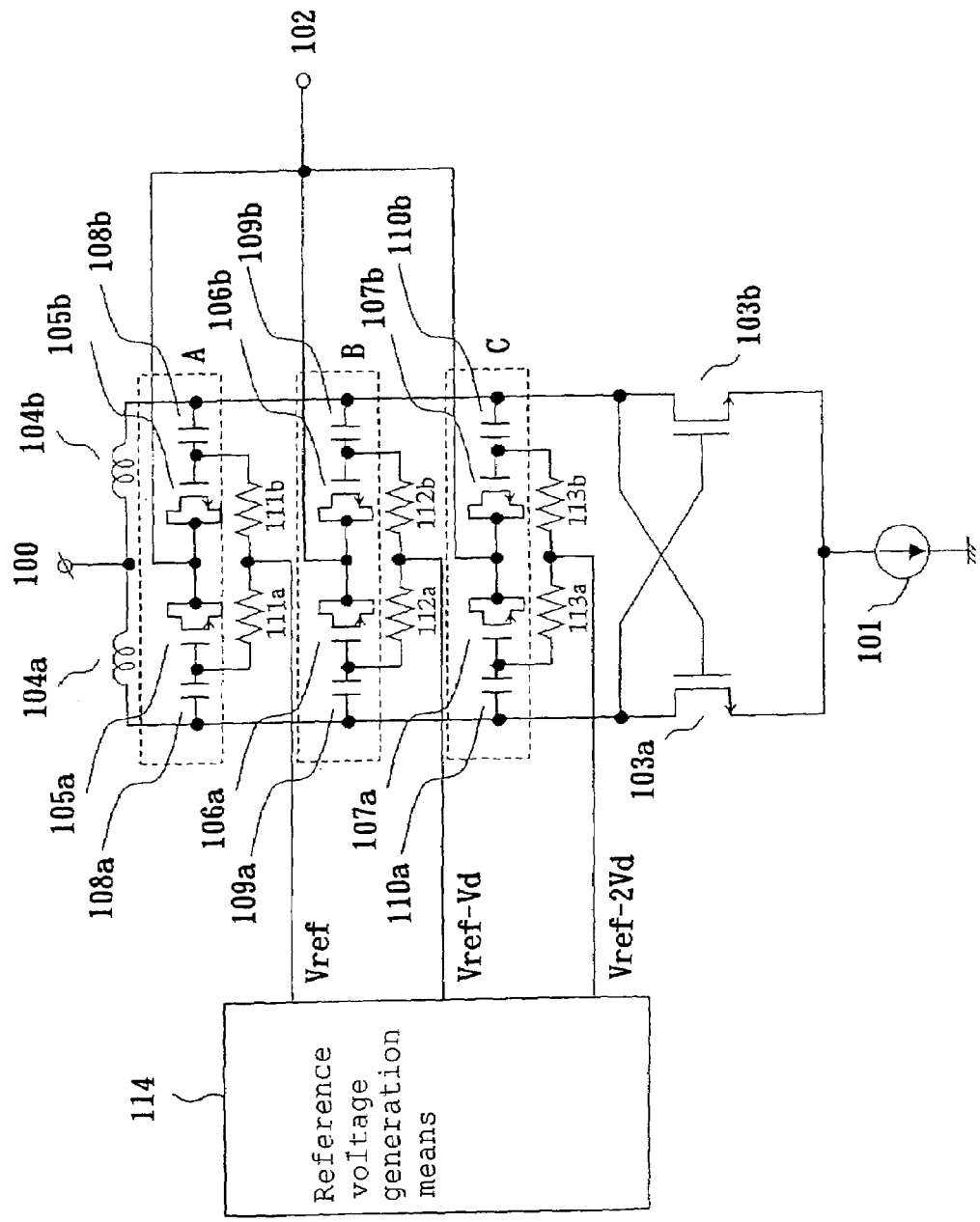
FIG. 1 is a circuit diagram showing a configuration of a voltage-controlled oscillator according to a first embodiment of the present invention.

100 Power source terminal
101 current source
102 Frequency control terminal 103a, 103b Oscillation transistors
104a, 104b Inductors
105a, 105b, 106a, 106b, 107a, 107b Variable capacitance elements
108a, 108b, 109a, 109b, 110a, 110b DC-cut capacitors
111a, 111b, 112a, 112b, 113a, 113b High-frequency blocking resistors
114 Reference voltage generation means

PREFERRED EMBODIMENTS OF THE INVENTION

Hereafter, embodiments of the present invention will be described by referring to the drawings.

(First Embodiment)

FIG. 1 shows a configuration of a voltage-controlled oscillator according to a first embodiment of the present invention, in which a bias circuit and so on is omitted.

In FIG. 1, reference numeral 100 denotes a power source terminal as an example of a power supply terminal of the present invention, 101 denotes a current source, and 102 denotes a frequency control terminal. Reference numerals 103a and 103b denote oscillation transistors, 104a and 104b denote inductors, 105a, 105b, 106a, 106b, 107a and 107b denote variable capacitance elements utilizing a gate capacitance used in a CMOS process, and 108a, 108b, 109a, 109b, 110a and 110b denote DC-cut capacitors as an example of a blocking capacitor of the present invention. Reference numerals 111a, 111b, 112a, 112b, 113a and 113b denote high-frequency blocking resistances, and 114 denotes reference voltage generation means.

The inductors 104a and 104b are series-connected, where the power source terminal 100 is connected to a connection point thereof so as to form an inductor circuit of the present invention. The variable capacitance elements 105a and 105b are formed by being connected on a drain side and a source side, and the DC-cut capacitors 108a and 108b of interrupting direct currents are series-connected to both sides of a series circuit of the variable capacitance elements 105a and 105b. The series circuit (hereafter, referred to as a variable capacitance circuit A) of the variable capacitance elements 105a and 105b and the DC-cut capacitors 108a and 108b constitutes the variable capacitance circuit of the present invention. Likewise, the series circuit (hereafter, referred to as a variable capacitance circuit B) of the variable capacitance elements 106a and 106b and the DC-cut capacitors 109a and 109b and the series circuit (hereafter, referred to as a variable capacitance circuit C) of the variable capacitance elements 107a and 107b and the DC-cut capacitors 110a and 110b constitute the variable capacitance circuits of the present invention. The oscillation transistors 103a and 103b constitute a negative resistance circuit of the present invention. And the above inductor circuit, variable capacitance circuits A, B and C and the negative resistance circuit of the present invention are mutually connected in parallel.

The frequency control terminal 102 is connected to the connection point of the variable capacitance elements 105a and 105b in the variable capacitance circuit A, the connection point of the variable capacitance elements 106a and 106b in the variable capacitance circuit B, and the connection point of the variable capacitance elements 107a and 107b in the variable capacitance circuit C, that is, to the drain-source side as an example of one terminal of the variable capacitance element of the present invention.

The gate sides of the variable capacitance elements 105a and 105b of the variable capacitance circuit A are connected to one output of the reference voltage generation means 114 via the resistors 111a and 111b respectively. The gate sides of the variable capacitance elements 106a and 106b of the variable capacitance circuit B are connected to another output of the reference voltage generation means 114 via the resistors 112a and 112b respectively. The gate sides of the variable capacitance elements 107a and 107b of the variable capacitance circuit C are connected to another output of the reference voltage generation means 114 via the resistors 113a and 113b respectively.

Figure 3:
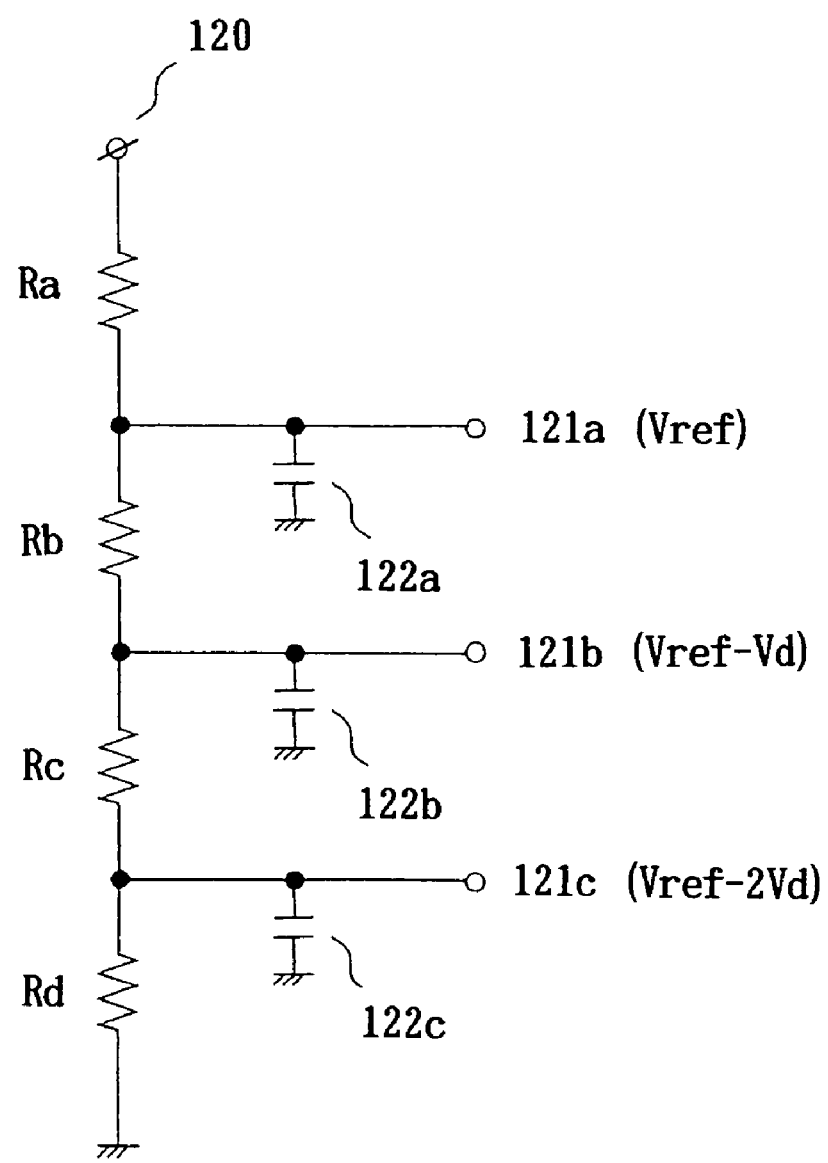
FIG. 3 is a circuit diagram showing the configuration of reference voltage generation means of the voltage-controlled oscillator according to the first embodiment of the present invention.

FIG. 3 shows the configuration example of the reference voltage generation means 114. In FIG. 3, reference numeral 120 denotes the power source terminal, Ra to Rd denote the resistors, and 122a to 122c denote grounded capacitive elements. Reference numeral 121a denotes an output terminal of outputting Vref as an example of a predetermined reference voltage of the present invention. Reference numeral 121b denotes the output terminal of outputting Vref−Vd as another example of the predetermined reference voltage of the present invention, and 121c denotes the output terminal of outputting Vref−2Vd as a further example of the predetermined reference voltage of the present invention.

Hereafter, operation of the voltage-controlled oscillator according to the first embodiment will be described by referring to FIG. 3.

As for the reference voltage generation means 114 in FIG. 3, it will be represented as follows if the voltage applied to the power source terminal 120 is Vcc and a voltage of signals outputted from the output terminals 121a to 121c is Rb=Rc.

$$Vref = Vcc \cdot (Rb+Rc+Rd)/(Ra+Rb+Rc+Rd)$$

$$Vref - Vd = Vcc \cdot (Rc+Rd)/(Ra+Rb+Rc+Rd)$$

$$Vref - 2Vd = Vcc \cdot (Rd)/(Ra+Rb+Rc+Rd) \qquad \text{[Formula 1]}$$

It is possible, by appropriately selecting values of Ra to Rd, to generate a reference signal having a desired voltage difference from the reference voltage generation means 114.

In FIG. 1, it is assumed that an inductance of the inductors 104a and 104b is L, a capacitance value of the variable capacitance elements 105a and 105b is C1, the capacitance value of the variable capacitance elements 106a and 106b is C2, the capacitance value of the variable capacitance elements 107a and 107b is C3, and the capacitance value of the DC-cut capacitors 108a, 108b, 109a, 109b, 110a and 110b is C0. In this case, a resonance frequency f0 of a parallel resonant circuit constituted by connecting the inductor circuit and variable capacitance circuits A, B and C in parallel is represented as follows.

$$f0=1/(2\pi(2L \cdot C'/2)^{1/2})=1/(2\pi(L \cdot C')^{1/2})$$

$$C'=C1 \cdot C0/(C1+C0)+C2 \cdot C0/(C2+C0)+C3 \cdot C0/(C3+C0) \quad \text{[Formula 2]}$$

Three reference voltages different by a voltage difference Vd are outputted from the reference voltage generation means 114 as described above. They are added to the gate side of the variable capacitance elements 105a and 105b of the variable capacitance circuit A, the gate side of the variable capacitance elements 106a and 106b of the variable capacitance circuit B, and the gate side of the variable capacitance elements 107a and 107b of the variable capacitance circuit C respectively.

A control voltage of feedback-controlling an oscillation frequency is inputted from the frequency control terminal 102 to the drain-source side of each variable capacitance element of the variable capacitance circuits A, B and C.

Figure 2:
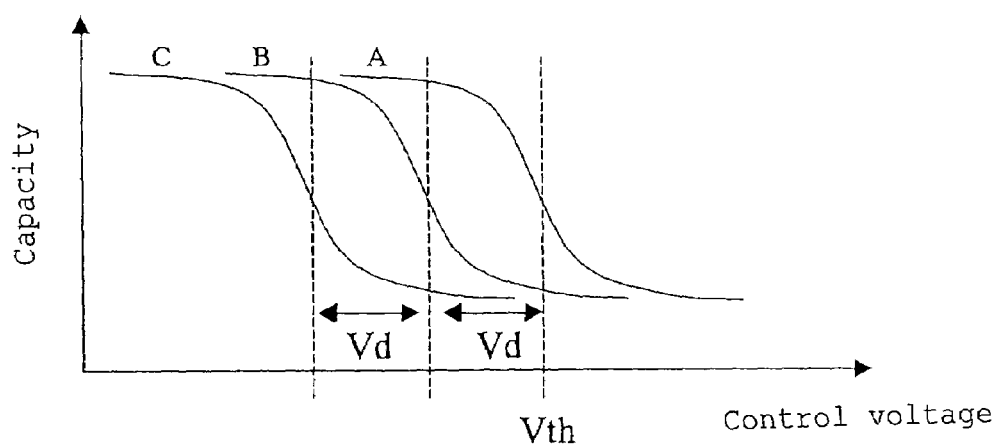
FIG. 2($a$) is a diagram for explaining a principle of operation of the voltage-controlled oscillator according to the first embodiment of the present invention.
Figure 2:
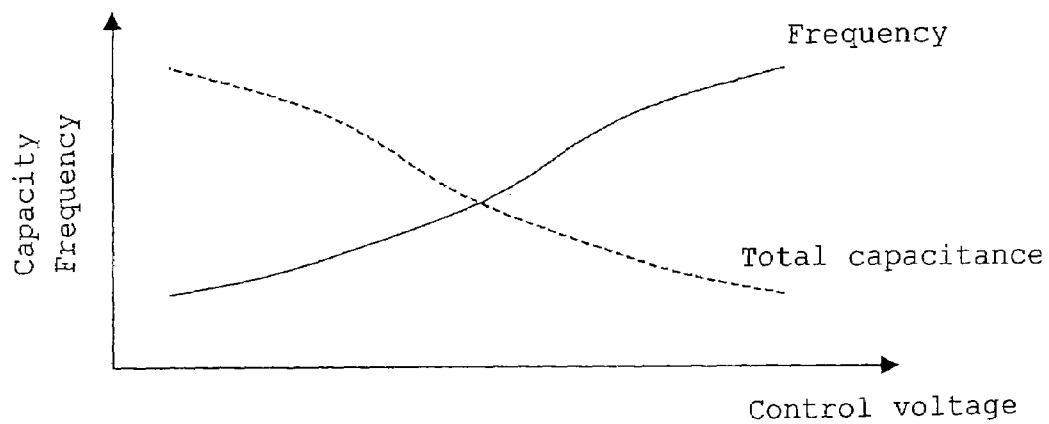

If the capacitance of each variable capacitance element changes in the neighborhood of a control voltage Vth when the reference voltage is Vref, the capacitance values of the variable capacitance circuits A, B and C change against a frequency control voltage as in FIG. 2(a). Therefore, a total capacitance of the variable capacitance circuits A, B and C slowly increases against the control voltage as shown in FIG. 2(b), and as a result, change in the oscillation frequency can be rendered moderate over a wide range of the control voltage. The control voltage in this case is the voltage difference between each reference voltage and the control voltage.

According to the present invention, it is possible to curb degradation of a phase noise characteristic because no additional circuit such as a level shift circuit is inserted between the frequency control terminal 102 and each variable capacitance circuit. As the voltage applied to the power source terminal 100 and the reference voltage applied to the variable capacitance elements 105a, 105b, 106a, 106b, 107a and 107b are separated by the DC-cut capacitors 108a, 108b, 109a, 109b, 110a and 110b so that it also has an effect of curbing the change in the frequency due to the variation in the power supply voltage.

Figure 4:
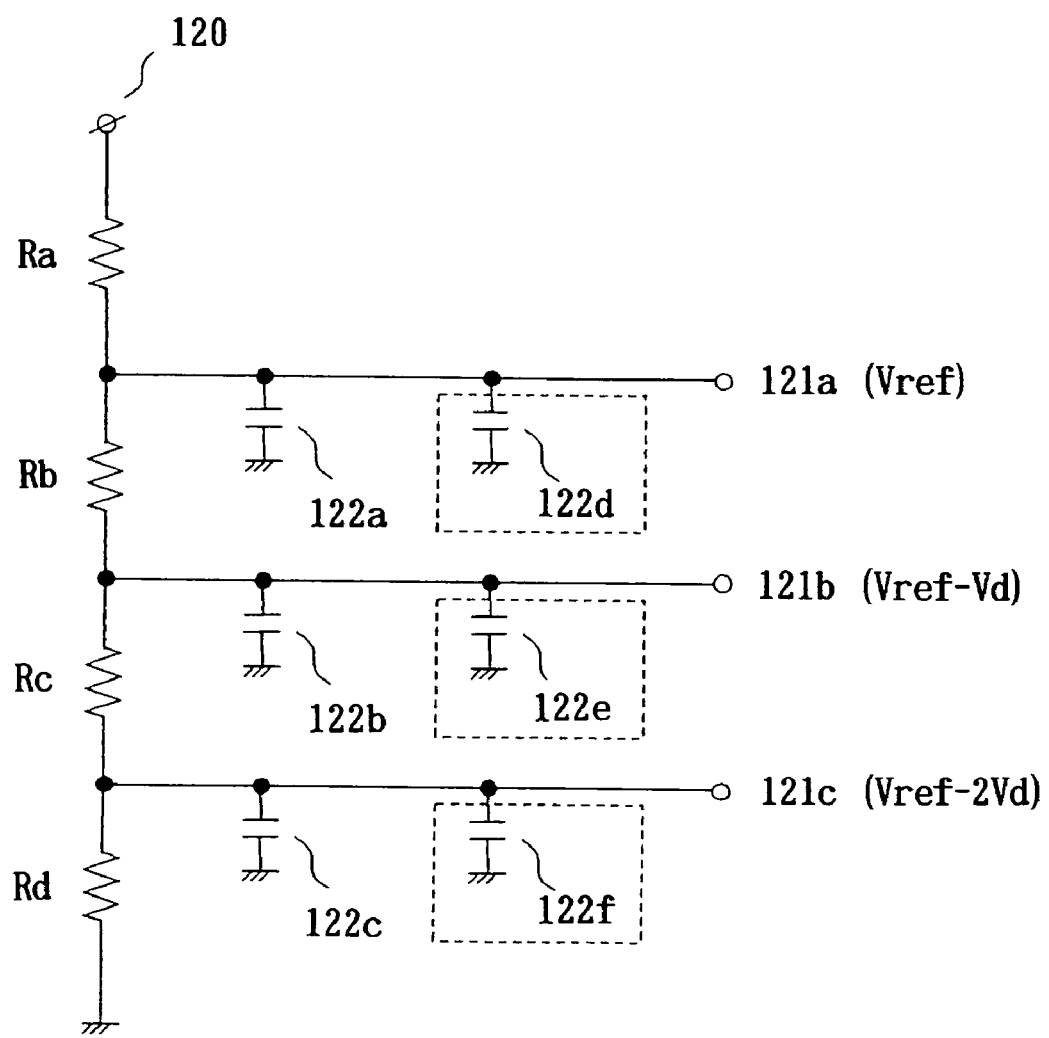
FIG. 4 is a circuit diagram showing the configuration of the reference voltage generation means of the voltage-controlled oscillator according to the first embodiment of the present invention.

The grounded capacitive elements 122a to 122c are bypass capacitive elements for the sake of suppressing noise outputted from the reference voltage generation means 114. According to the present invention, even if the capacitive elements are inserted in parallel into the output terminals 121a, 121b and 121c, there is no influence on a transient response characteristic and a noise band characteristic of the PLL circuit, so that the capacitive elements of a large capacitance value can be inserted. To be more specific, even if the capacitive elements of a large capacitance are inserted and even if the control voltage inputted from a frequency control terminal 5 changes, response thereof will not deteriorate. Therefore, it is possible to insert sufficiently large capacitive elements necessary to curb the noise. Furthermore, it is possible, as shown in FIG. 4, to constitute the capacitive elements of the large capacitance indicated by 122d to 122f as chip components and so on on the outside of a semiconductor so as to have a further significant noise suppression effect.

Figure 5:
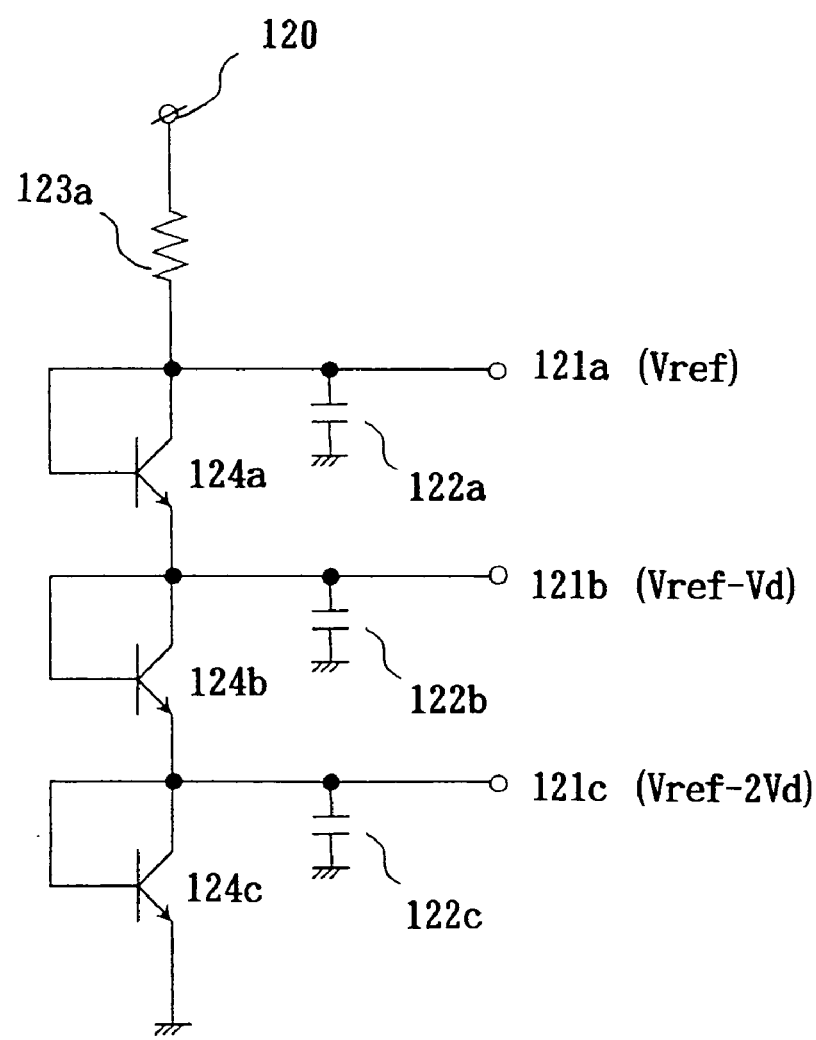
FIG. 5 is a circuit diagram showing the configuration of the reference voltage generation means of the voltage-controlled oscillator according to the first embodiment of the present invention.

FIG. 5 is another configuration example of the reference voltage generation means 114, and the same portions as those previously described are given the same symbols. In FIG. 5, reference numerals 124a to 124c denote transistors.

If the voltage between a base and an emitter of the transistors 124a to 124c is Vbe, collectors and bases of the transistors 124a to 124c can be connected to operate as diodes, and so the voltage difference per stage of diodes can be approximately Vbe.

Therefore, it can be set up as follows.

$$Vref=3Vbe$$

$$Vref-Vd=2Vbe$$

$$Vref-2Vd=Vbe \quad \text{[Formula 3]}$$

As for the above circuit, even if a power supply voltage changes, the voltage difference per stage of diodes is Vbe and it hardly changes. Therefore, it is possible to stabilize the voltage difference of the signals outputted from the reference voltage generation means 114 so as to realize the oscillator which is hardly influenced by variation in the power supply voltage.

Figure 6:
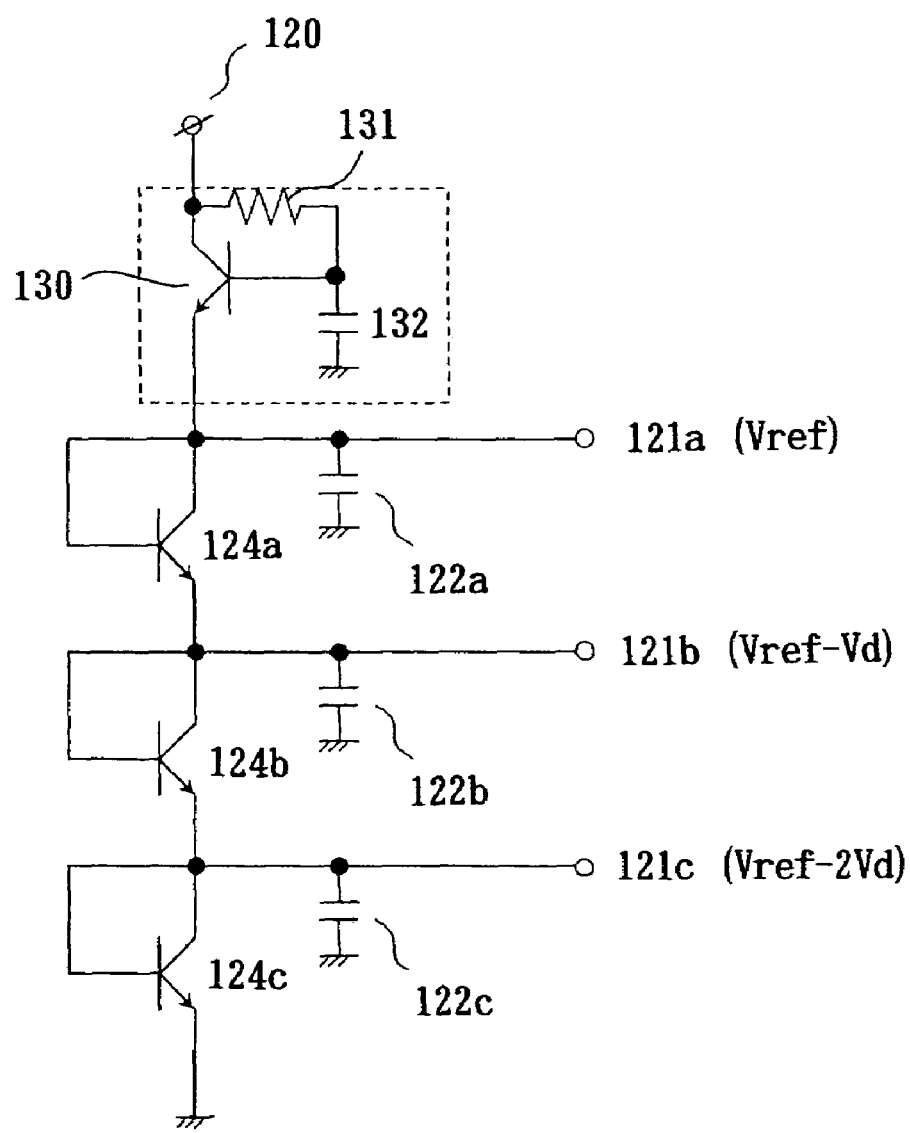
FIG. 6 is a circuit diagram showing the configuration of the reference voltage generation means of the voltage-controlled oscillator according to the first embodiment of the present invention.

FIG. 6 is another configuration example of the reference voltage generation means 114, and the same portions as those previously described are given the same symbols. In FIG. 6, reference numeral 130 denotes the transistor, 131 denotes the resistor, and 132 denotes the capacitive element, and the portion surrounded by a broken line constitutes an active filter. The resistor 131 series-connected to the base of the transistor 130 and the grounded capacitive element 132 constitute an LPF (low-pass filter). Here, the variable capacitance element to be used is designed to satisfy [Formula 5] in [Formula 4] in the case where a threshold voltage is Vth, the power supply voltage is Vcc, and the base-emitter voltage of the transistor is Vbe.

$$Vref=Vcc-Vbe \quad \text{[Formula 4]}$$

$$Vth<Vcc \quad \text{[Formula 5]}$$

According to this configuration, it is possible to eliminate the noise from a power supply with a ripple filter so as to curb the variation in the reference voltage due to the noise from the power supply compared to the configuration in FIG. 5.

Figure 7:
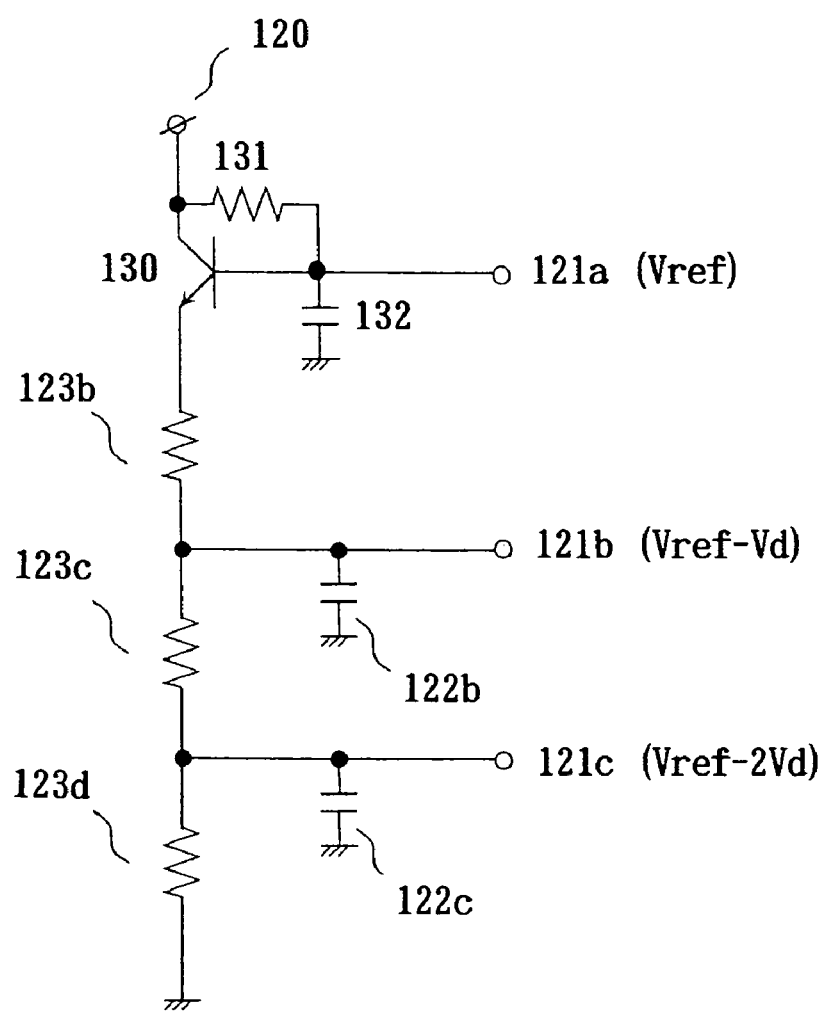
FIG. 7 is a circuit diagram showing the configuration of the reference voltage generation means of the voltage-controlled oscillator according to the first embodiment of the present invention.

As shown in FIG. 7, it is also possible, as a further configuration example of the reference voltage generation means 114, to connect the terminal 121a to the base of the transistor 130. The voltage of the terminal 121a becomes lower than the power supply voltage by Vbe in the aforementioned configuration in FIG. 6, whereas the voltage of the terminal 121a can be set in the neighborhood of the power supply voltage in the configuration shown in FIG. 7. Therefore, it is possible to set the reference voltage in the range of 0V to the power supply voltage.

According to this embodiment, the difference between the reference voltage outputted from the output terminal 121a of the reference voltage generation means 114 and the reference voltage outputted from the output terminal 121b and the difference between the reference voltage outputted from the output terminal 121b and the reference voltage outputted from the output terminal 121c are fixed. However, it goes without saying that different voltage differences may be given. In that case, it should be Rb≠Rc as to the circuit in FIG. 3 for instance.

The above describes the example in which there are three variable capacitance circuits connected in parallel and three reference voltages are outputted from the reference voltage generation means 114. However, it is not necessarily limited to three, but may be two in parallel or four or more in parallel in the configuration.

In that case, there are n (n is two or more) pieces of the variable capacitance circuit as described above, and n pieces of different reference voltages are outputted from the reference voltage generation means 114 so as to be inputted to the gate side of each variable capacitance element of the n pieces of the variable capacitance circuit. And the control voltage is inputted to the drain-source side of each variable capacitance element of the n pieces of the variable capacitance circuit, so that the n pieces of output sides of the reference voltage generation means 114 should be grounded via the capacitive elements respectively.

In that case, when the n pieces of variable capacitance circuits are arranged in decreasing order of reference voltages inputted to said n pieces of variable capacitance circuits, the difference between the voltage inputted to the gate side of an m-th (m is between 2 and n) variable capacitance circuit and the voltage inputted to the gate side of an m−1-th variable capacitance circuit should be Vd.

The reference voltage generation means 114 in that case should have the configuration wherein, in the example shown in FIG. 3 for instance, n+1 pieces of resistors are series-connected, and the power supply voltage supplied from the power source terminal 120 is divided as n pieces of reference voltage by the n+1 pieces of resistor so as to be outputted.

In the case where the reference voltage generation means is the example shown in FIG. 5 or 6, it should have the configuration wherein n pieces of diodes or transistors are series-connected, and the power supply voltage is divided as n pieces of reference voltage. In that case, the same effect as described above can be obtained.

The above describes that the difference between the voltage inputted to the m-th variable capacitance circuit and that inputted to the m−1-th variable capacitance circuit is Vd. However, the difference between the voltages may be different values, and the same effect as described above can be obtained in that case.

The above describes that n pieces of different reference voltages are outputted from the reference voltage generation means 114 to be inputted to the gate side of each variable capacitance element of the n pieces of the variable capacitance circuit. However, it may also be the configuration wherein n pieces of reference voltages are outputted from the reference voltage generation means 114 to be inputted to the gate side of each variable capacitance element of then pieces of variable capacitance circuit, and at least two of the n pieces of reference voltages are different voltages. In that case, the same effect as described above can be obtained.

(Second Embodiment)

Figure 8:
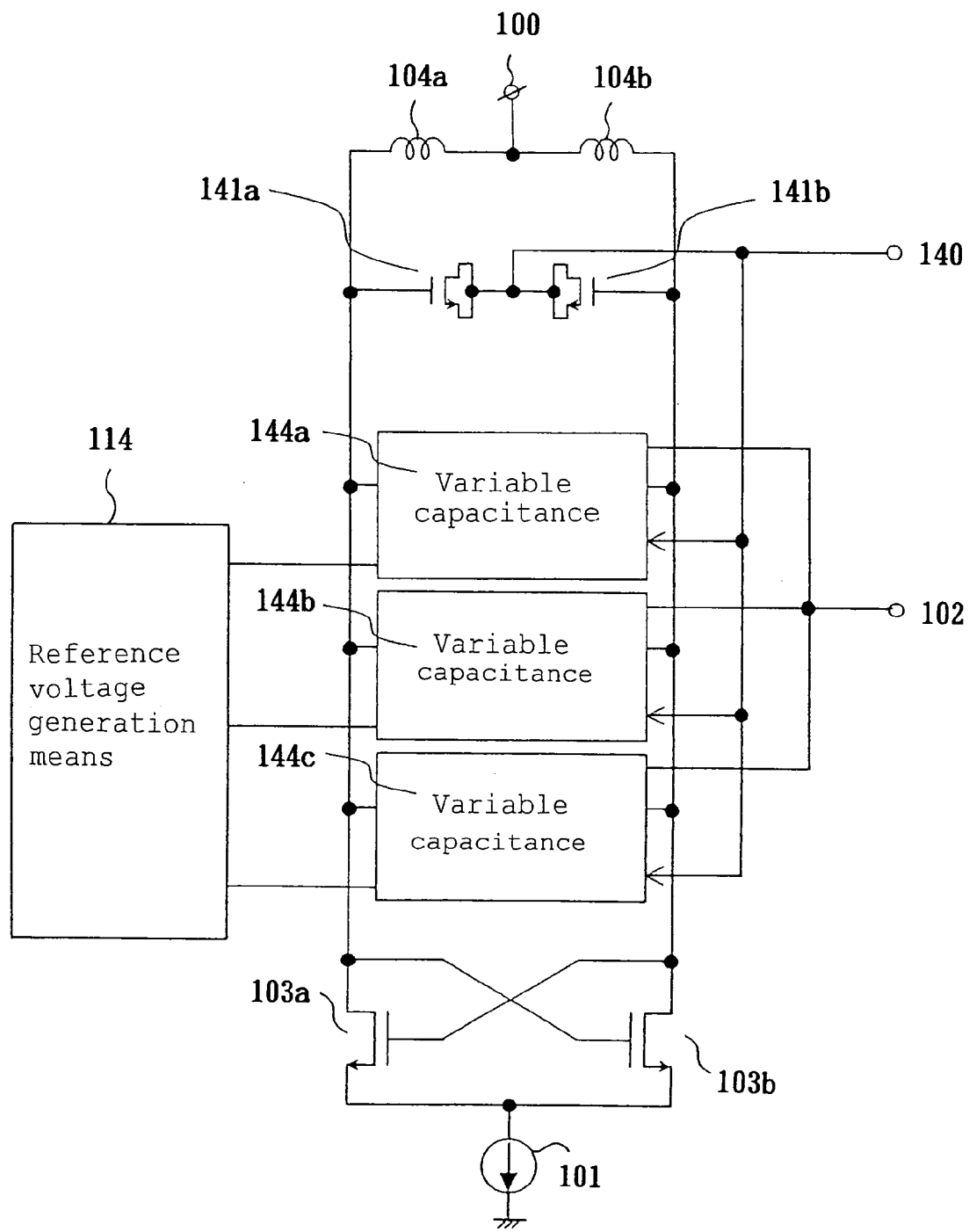
FIG. 8 is a circuit diagram showing the configuration of the voltage-controlled oscillator according to a second embodiment of the present invention.

FIG. 8 shows a configuration of the voltage-controlled oscillator according to a second embodiment of the present invention, in which the same portions as those previously described are given the same symbols and a description thereof will be omitted.

As for the voltage-controlled oscillator according to the first embodiment, there are the cases where there is a frequency domain in which the change in the capacitance of the variable capacitance element gets saturated even if the control voltage is changed. The voltage-controlled oscillator according to this embodiment relates to the voltage-controlled oscillator capable of changing the capacitance of the variable capacitance circuit according to a frequency band.

In FIG. 8, reference numerals 141a and 141b denote frequency band setting variable capacitance elements, 144a, 144b and 144c denote the variable capacitance circuits, and 140 denotes a frequency band setting terminal. The variable capacitance elements 141a and 141b are mutually connected on the drain-source side to form the series circuit, constituting a first variable capacitance circuit of the present invention. The frequency band setting terminal 140 is connected to the connection point on the drain-source side of the first variable capacitance circuit.

Figure 9:
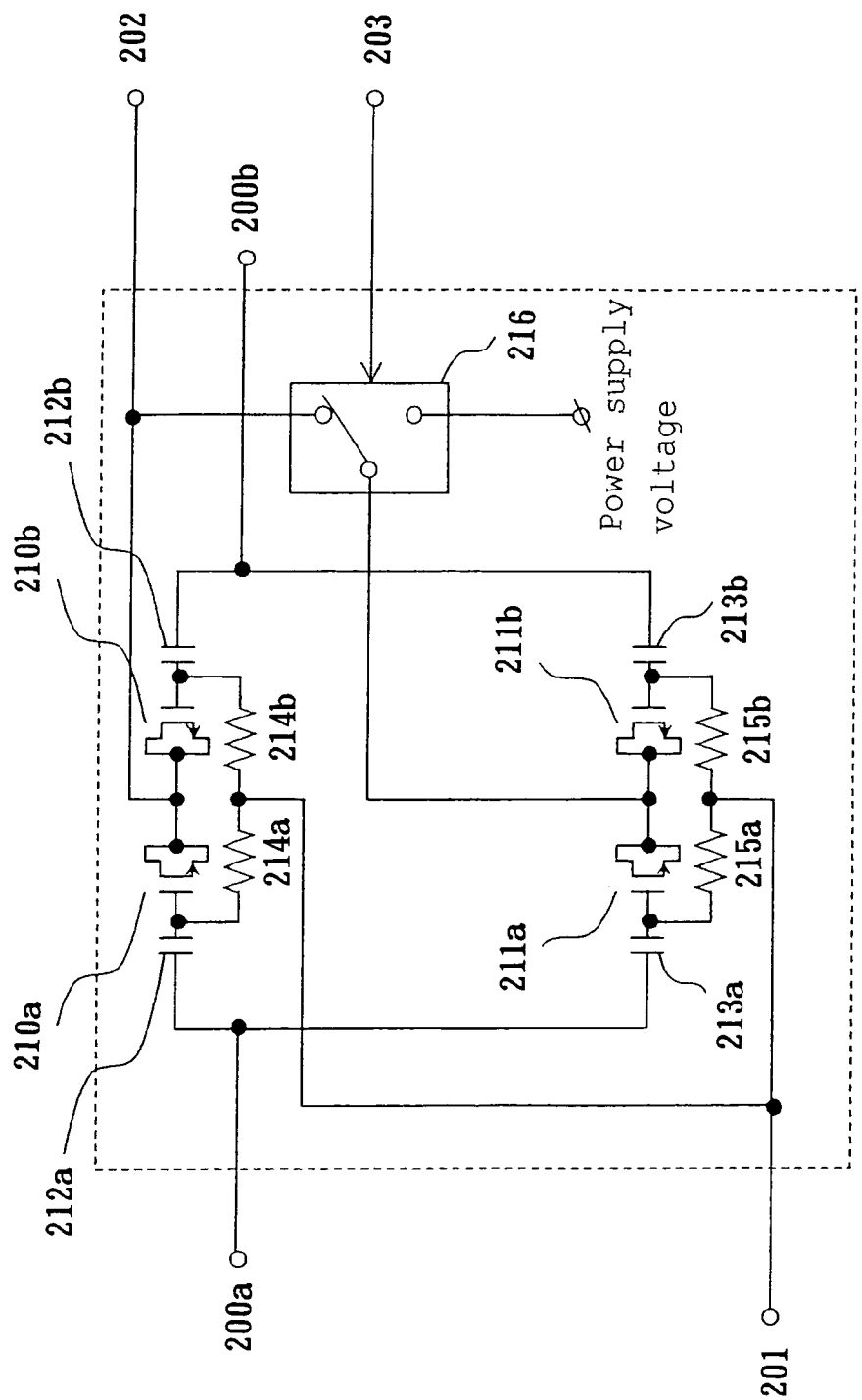
FIG. 9 is a circuit diagram showing the configuration of a variable capacitance of the voltage-controlled oscillator according to the second embodiment of the present invention.

FIG. 9 shows an internal configuration of the variable capacitance circuits indicated by 144a to 144c. In FIG. 9, reference numerals 200a and 200b denote connection terminals of connecting the first variable capacitance circuit and the variable capacitance circuits 144a to 144c in parallel. Here, a terminal 201 is connected to the reference voltage generation means 114 in FIG. 8, a terminal 202 is connected to the frequency control terminal 102, and a terminal 203 is connected to the frequency band setting terminal 140.

Reference numerals 210a, 210b, 211a and 211b denote the variable capacitance elements, 212a, 212b, 213a and 213b denote the DC-cut capacitors, 214a, 214b, 215a and 215b denote high-frequency blocking resistors, and 216 denotes a switch.

The variable capacitance elements 210a and 210b are mutually connected on the drain-source side, and the DC-cut capacitors 212a and 212b of interrupting the direct currents are series-connected to both ends of the series circuit of the variable capacitance elements 210a and 210b (hereafter, the series circuit formed by the variable capacitance elements 210a and 210b and the DC-cut capacitors 212a and 212b is referred to as a second variable capacitance circuit).

The variable capacitance elements 211a and 211b are mutually connected on the drain-source side, and the DC-cut capacitors 213a and 213b of interrupting the direct currents are series-connected to both ends of the series-circuit of the variable capacitance elements 211a and 211b (hereafter, the series circuit formed by the variable capacitance elements 211a and 211 band the DC-cut capacitors 213a and 213b is referred to as a third variable capacitance circuit).

The second variable capacitance circuit and the third variable capacitance circuit are connected in parallel, and are connected to the connection terminals 200a and 200b. And the gate side of the second variable capacitance circuit and the gate side of the third variable capacitance circuit are connected to the reference voltage generation means 114 via the resistors 214a and 214b and the resistors 215a and 215b respectively.

The drain-source connection side of the second variable capacitance circuit is connected to the frequency control terminal 202, and the drain-source connection side of the third variable capacitance circuit is connected to the output side of the switch 216. One terminal on the input side of the switch 216 is connected to the frequency control terminal 202, and the other terminal thereon is connected to the power supply.

The switch 216 is connected with the control terminal 203, and the control terminal 203 is connected with the frequency band setting terminal 140. And the switch 216 has the configuration wherein one side of the input side of the switch 216 and the other side thereof are switched according to a signal outputted from the frequency band setting terminal 140.

Hereafter, the operation of the present invention will be described by referring to FIGS. 8 and 9.

Figure 10A:
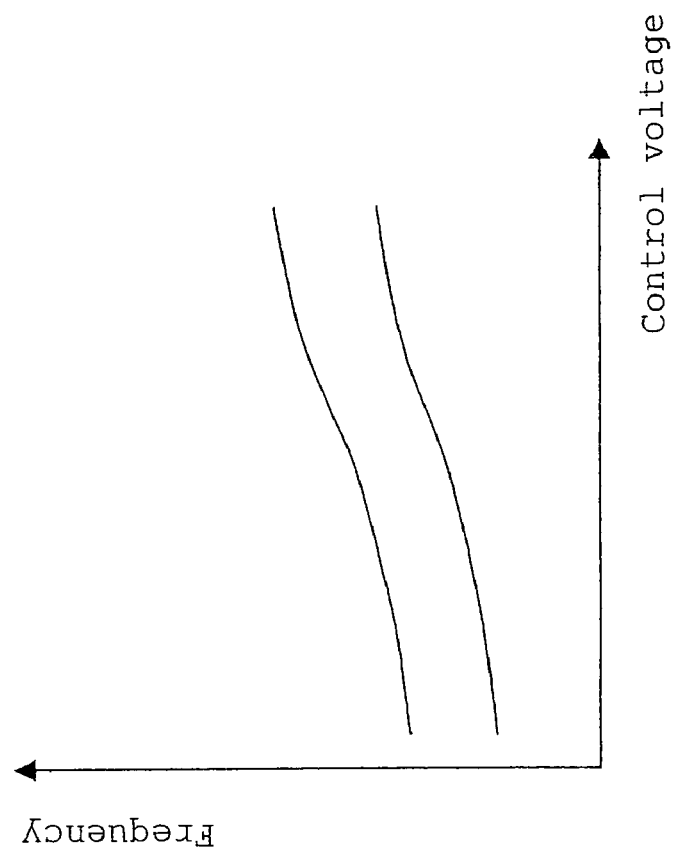
FIG. 10($a$) is a diagram for explaining a principle of the voltage-controlled oscillator according to the second embodiment of the present invention.

The voltage-controlled oscillator according to the present invention applies a ground voltage or the power supply voltage to the frequency band setting terminal 140 on starting the operation and thereby changes the capacitance of the variable capacitance elements 141a and 141b of the first variable capacitance circuit so as to select the frequency band to be used. Thereafter, it fine-tunes the oscillation frequency with the control voltage applied to the frequency control terminal 102. The method of switching the frequency band is already described in Japanese Patent Laid-Open No. 2001-196853. However, as shown in FIG. 10(a), the method in the past has a problem that the higher the frequency band to be used is, the more abrupt the change in the frequency against the control voltage becomes. The reason for this is that, if the frequency band becomes higher, the capacitance values of the frequency band setting variable capacitance elements 141a and 141b become smaller so that, as a result, the capacitance values of the variable capacitance circuits 144a to 144c become relatively larger against all the parallel capacitance values constituting a resonant circuit.

Figure 10B:
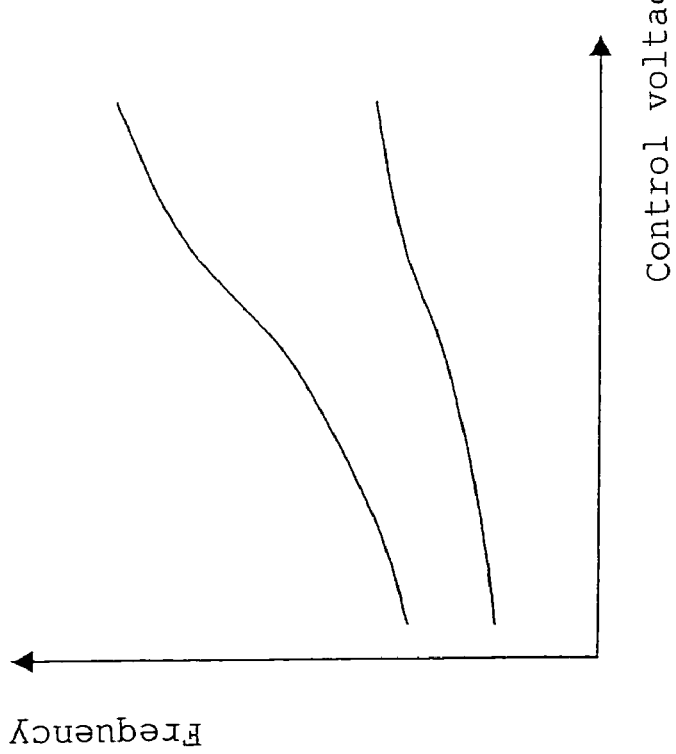

According to the present invention, the variable capacitance circuits indicated by 144a to 144c in FIG. 8 are constituted as shown in FIG. 9, and the capacitance values of the variable capacitance circuits 144a to 144c are changed according to the frequency band so as to change the variable range of the capacitance. To be more specific, in FIG. 9, the variable capacitance elements 210a and 210b are directly connected to the frequency control terminal 202, and the variable capacitance elements 211a and 211b are selectively connected to the frequency control terminal 202 or the power supply voltage by the switch 216. The voltage applied to the control terminal 203 of the switch 216 is switched synchronizing with the frequency band setting terminal 140. To be more specific, in the case where the frequency band on the low frequency side is used, the input side of the switch 216 is connected to the frequency control terminal 202, and is connected to the power supply voltage side in the case where the frequency band on the high frequency side is used. Therefore, it is possible, by appropriately setting the capacitance values of the variable capacitance elements 210a, 210b, 211a and 211b, to substantially fix the change in the frequency against the control voltage even in the case of switching to a plurality of bands as shown in FIG. 10(b).

Figure 11:
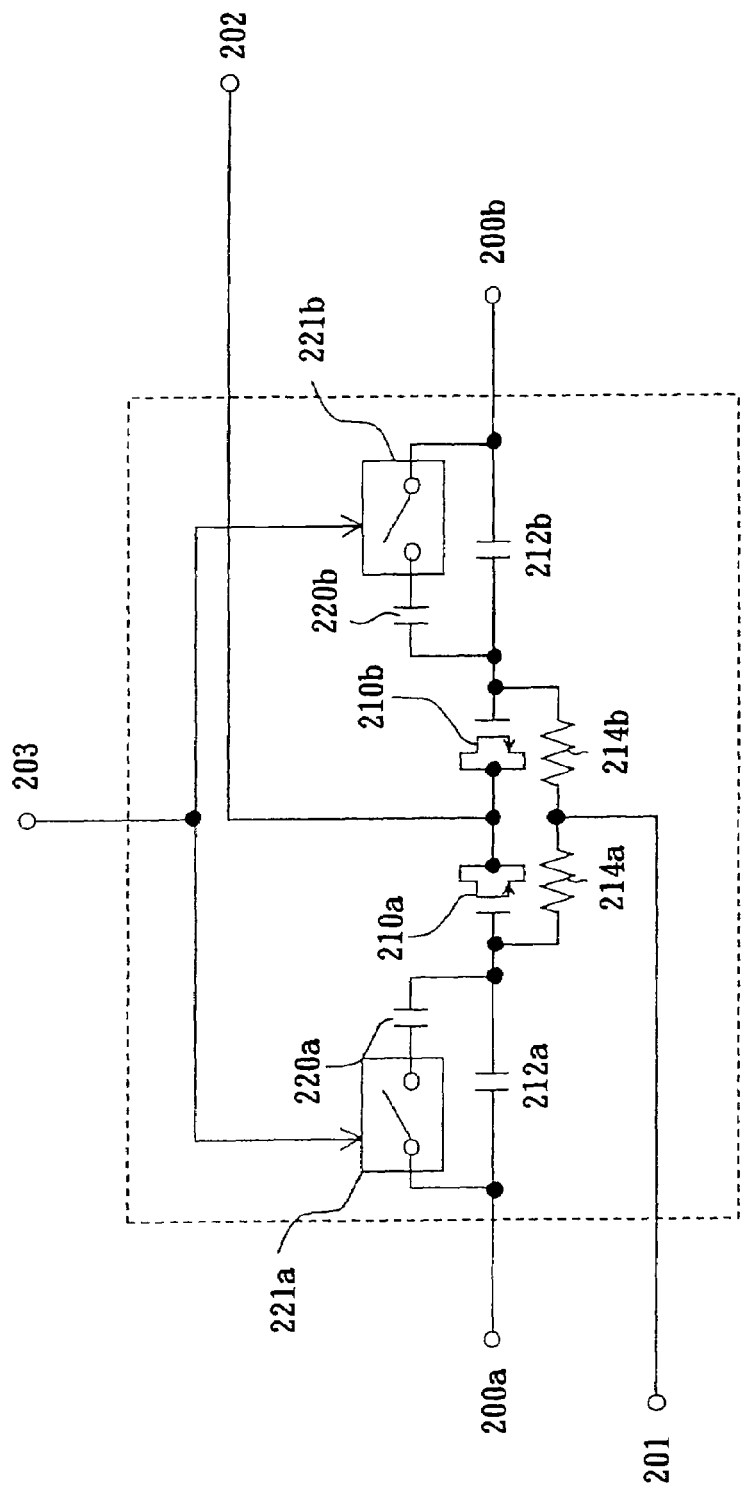
FIG. 11 is a circuit diagram showing another configuration example of the variable capacitance of the voltage-controlled oscillator according to the second embodiment of the present invention.
Figure 12:
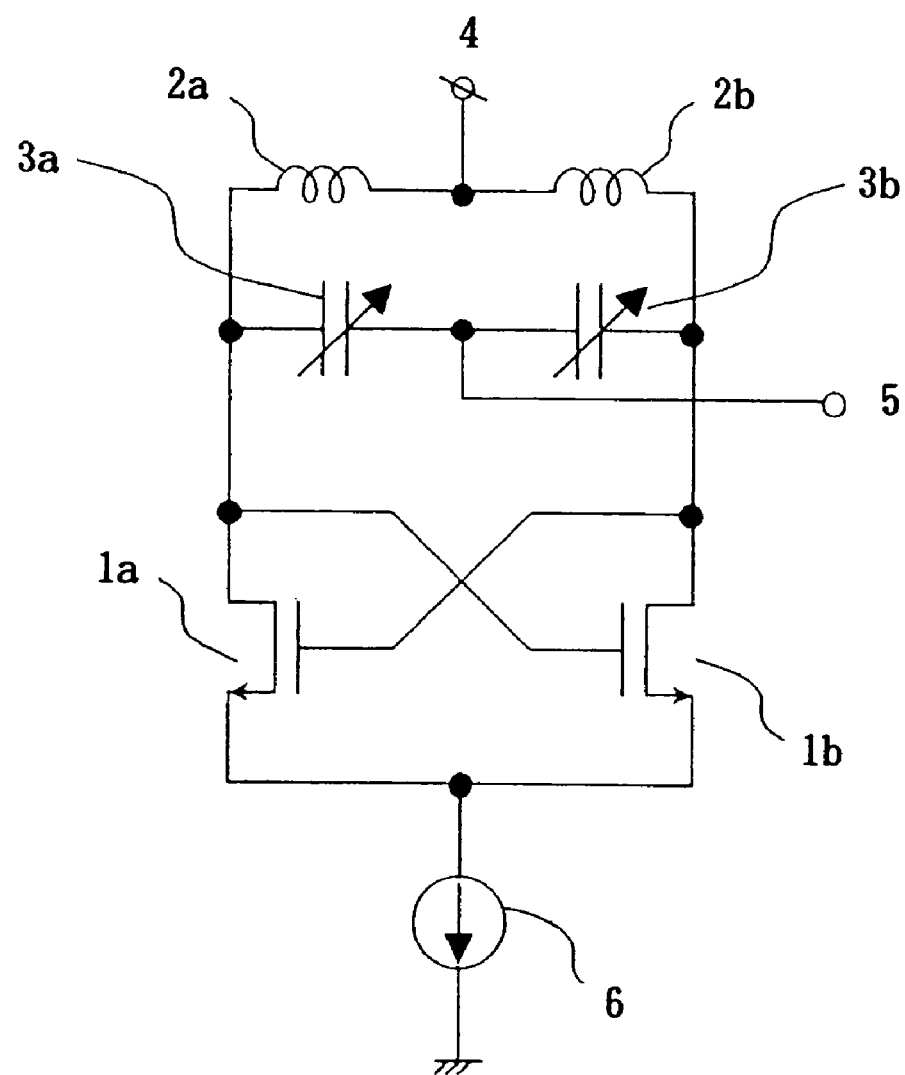
FIG. 12 is a circuit diagram showing the configuration of the voltage-controlled oscillator in the past.
Figure 14:
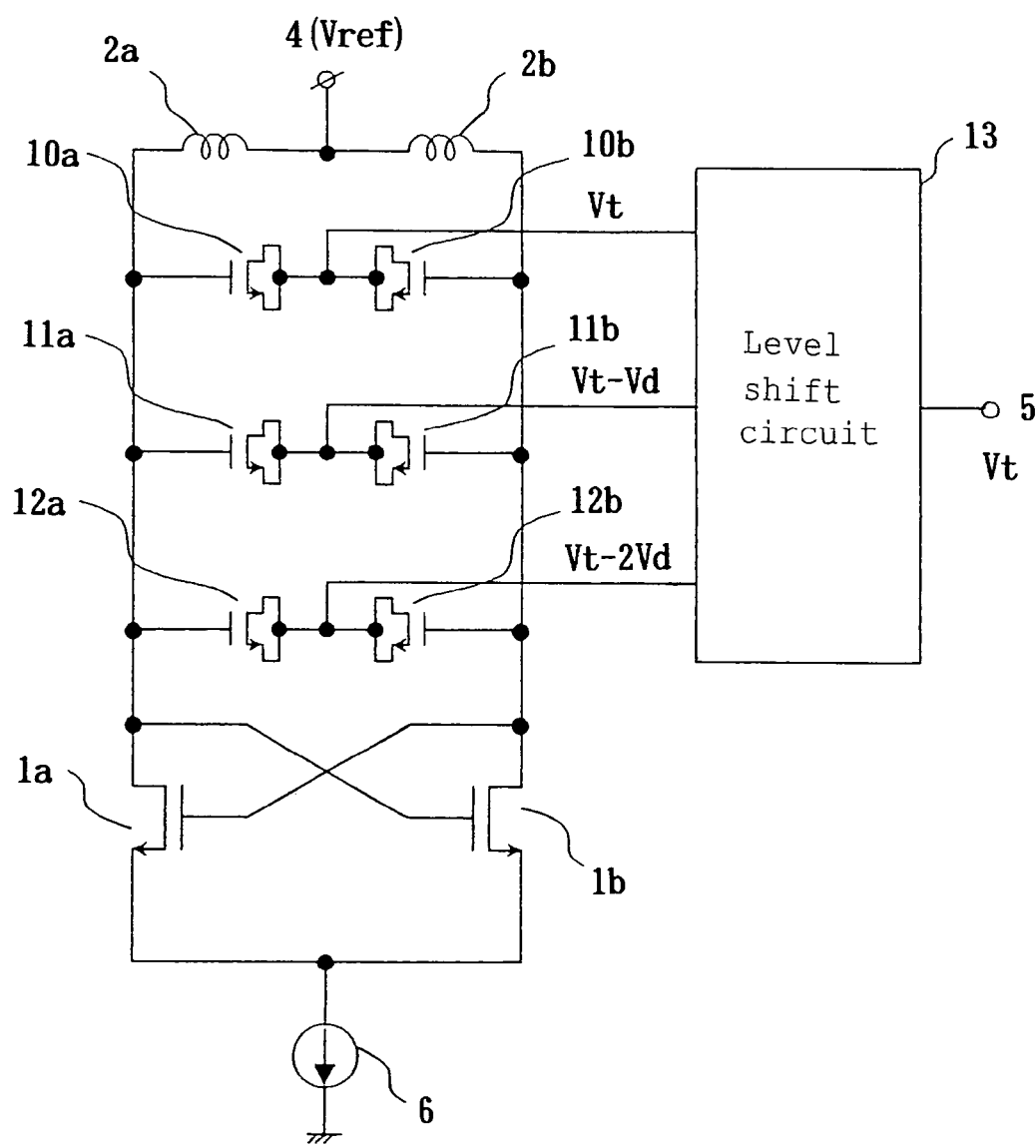
FIG. 14 is a circuit diagram showing the configuration of the voltage-controlled oscillator in the past.
Figure 15:
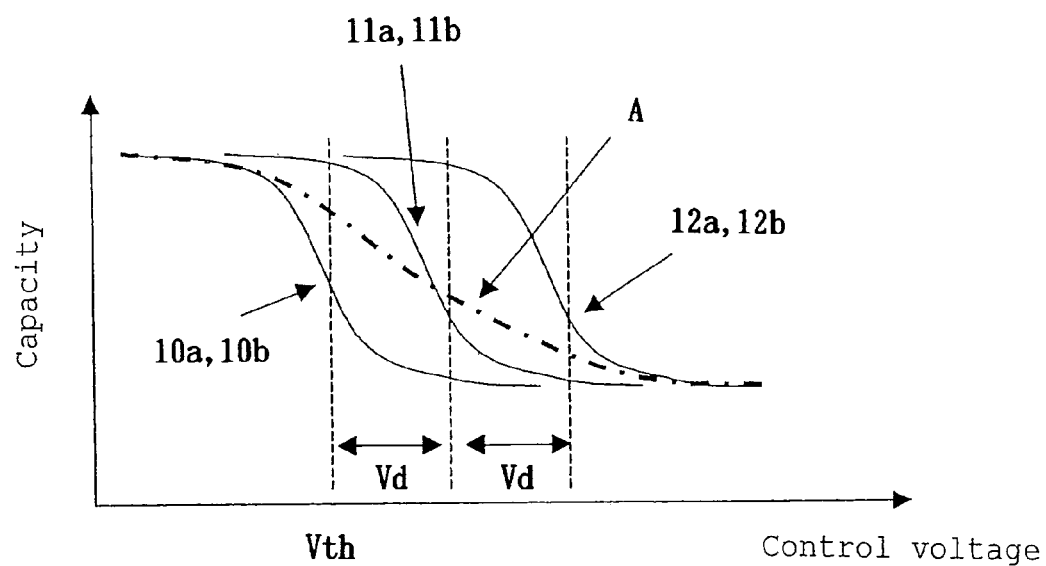
FIG. 15 is a diagram for explaining the principle of operation of the voltage-controlled oscillator in the past.

FIG. 11 shows another configuration example of the variable capacitors indicated by 144a to 144c in FIG. 8, and the same portions as the circuit shown in FIG. 9 are given the same symbols and a description thereof will be omitted.

In FIG. 11, reference numeral 220a and 220b denote the DC-cut capacitors, and 221a and 221b denote the switches. The switch 221a and the capacitor 220a are series-connected, and they are connected so that the capacitor 220a is connected to a capacitor 212a in parallel when the switch 221a is in a connection state. Likewise, the switch 221b and the capacitor 220b are series-connected, and they are connected so that the capacitor 220b is connected to a capacitor 212b in parallel when the switch 221b is in a connected state. And the switches 221a and 221b are connected to the control terminal 203, and are opened and closed according to the signal outputted from the frequency band setting terminal 140.

Hereafter, the operation in the case of using the circuit shown in FIG. 11 as the variable capacitance circuit shown in FIG. 8 will be described by referring to FIGS. 8 and 11.

The control terminal 203 of the switches 221a and 221b is connected to the frequency band setting terminal 140. In the case where the frequency band on the low frequency side is used, the switches 221a and 221b are set in the connected state. And in the case where the frequency band on the high frequency side is used, the switches 221a and 221b are set in an interrupted state.

Now, it is assumed that the capacitance value of the variable capacitance elements 210a and 210b is C0, the capacitance value of the DC-cut capacitors 212a and 212b is C1, and the capacitance value of the DC-cut capacitors 220a and 220b is C2. In this case, a total capacitance value C of 210a, 212a and 220a or 210b, 212b and 220b is represented as follows when the switches 221a and 221b are in the connected state.

$$C = C0 \cdot (C1+C2)/(C0+C1+C2) \quad \text{[Formula 6]}$$

And it is represented as follows when the switches 221a and 221b are in the interrupted state.

$$C = C0 \cdot C1/(C0+C1) \quad \text{[Formula 7]}$$

And it is possible to change the capacitance value of the entire variable capacitance circuit shown in FIG. 11 according to the operation of the switches 221a and 221b. To be more specific, it is possible, by appropriately lowering the variable range of the capacitance of the variable capacitance elements 210a, 210b, 211a and 211b according to reduction in the capacitance of the first variable capacitance circuit, to substantially fix the change in the frequency against the control voltage even in the case of switching to the plurality of bands as shown in FIG. 10(b). To be more specific, minute influence of the noise over the control voltage can be curbed even in the case of using the high frequency band.

According to this embodiment, the case of two frequency bands has been described. It is possible, however, to support three or more frequency bands with the same configuration. In that case, of the plurality of voltages, the voltage corresponding to the frequency band is inputted to the first variable capacitance circuit and the variable capacitance circuits 144a to 144c. Here, in the case where the circuit shown in FIG. 9 is used as the variable capacitance circuits 144a to 144c, there is a thinkable configuration wherein a different variable capacitance circuit of the same configuration is further connected in parallel in addition to the second variable capacitance circuit and third variable capacitance circuit, and the power supply voltage is inputted according to the voltage inputted from the frequency band setting terminal 140 as with the second variable capacitance circuit.

In the case where the circuit shown in FIG. 11 is used as the variable capacitance circuits 144a to 144c, there is a thinkable configuration wherein the series circuit of the switch and capacitor is further connected in parallel to the capacitors 212a and 212b, and the capacitor is further connected according to the voltage inputted from the frequency band setting terminal 140.

The voltage-controlled oscillator according to this embodiment may also have the configuration wherein the n pieces of variable capacitance circuit exist, at least one of the n pieces of variable capacitance circuit has at least one variable capacitance element, and of the plurality of voltages, the voltage according to the frequency to be used is inputted instead of the control voltage to the terminal on the drain-source side of this at least one variable capacitance element so that the variable range of the capacitance of at least one of the n pieces of variable capacitance circuit is lowered according to the reduction in the capacitance of the variable capacitance element of the first variable capacitance circuit.

The voltage-controlled oscillator according to this embodiment may also have the configuration wherein the DC-cut capacitor is comprised of two or more capacitors connected via the switch, and the capacitance of the DC-cut capacitor is reduced as the above switch is on or off according to the frequency to be used so that the variable range of the capacitance of at least one of the n pieces of variable capacitance circuit is lowered.

This embodiment has been described by taking the variable capacitance circuit shown in FIG. 9 or 11 as an example so far. However, the n pieces of variable capacitance circuit is not limited to the example shown in FIG. 9 or 11 but may be the variable capacitance of another configuration. To be more specific, the n pieces of variable capacitance circuit should have the configuration wherein the power supply voltage or the predetermined reference voltage is inputted to some terminals of the variable capacitance elements of the n pieces of variable capacitance circuit, the control voltage of feedback-controlling the oscillation frequency is inputted to the other terminals of the variable capacitance elements of said n pieces of variable capacitance circuits, and when the capacitance of the variable capacitance element of the first variable capacitance circuit becomes lower than the predetermined value, the variable range of the capacitance of at least one of the n pieces of variable capacitance circuit is lowered. In that case, the same effect as described above can be obtained.

According to the above description of this embodiment, the capacitive elements 122a, 122b and 122c are connected to the output side of the reference voltage generation means 114. However, the voltage-controlled oscillator according to this embodiment does not necessarily require the capacitive elements 122a, 122b and 122c. In that case, the same effect as described above can be obtained in that it is not influenced by the noise from the power supply voltage or the reference voltage.

According to the above description of the first and second embodiments, the reference voltages outputted from the reference voltage generation means 114 are inputted to the gate side of each variable capacitance element of the variable capacitance circuits and the control voltages are inputted to the drain-source side of each variable capacitance element of the variable capacitance circuits. However, it may also be the configuration wherein the control voltages are inputted to the gate side of each variable capacitance element of the variable capacitance circuits and the reference voltages are inputted to the drain-source side of each variable capacitance element of the variable capacitance circuits.

According to the above description, the variable capacitance elements are those utilizing the gate capacitance used in the CMOS process. However, the variable capacitance elements may be another type of variable capacitance elements. In that case, the reference voltages should be inputted to one side of each variable capacitance element and the control voltages should be inputted to the other side thereof, and the same effect as described above can be obtained.

(Third Embodiment)

The voltage-controlled oscillator according to a third embodiment of the present invention will be described next by referring to FIGS. 17 to 20.

Figure 17:
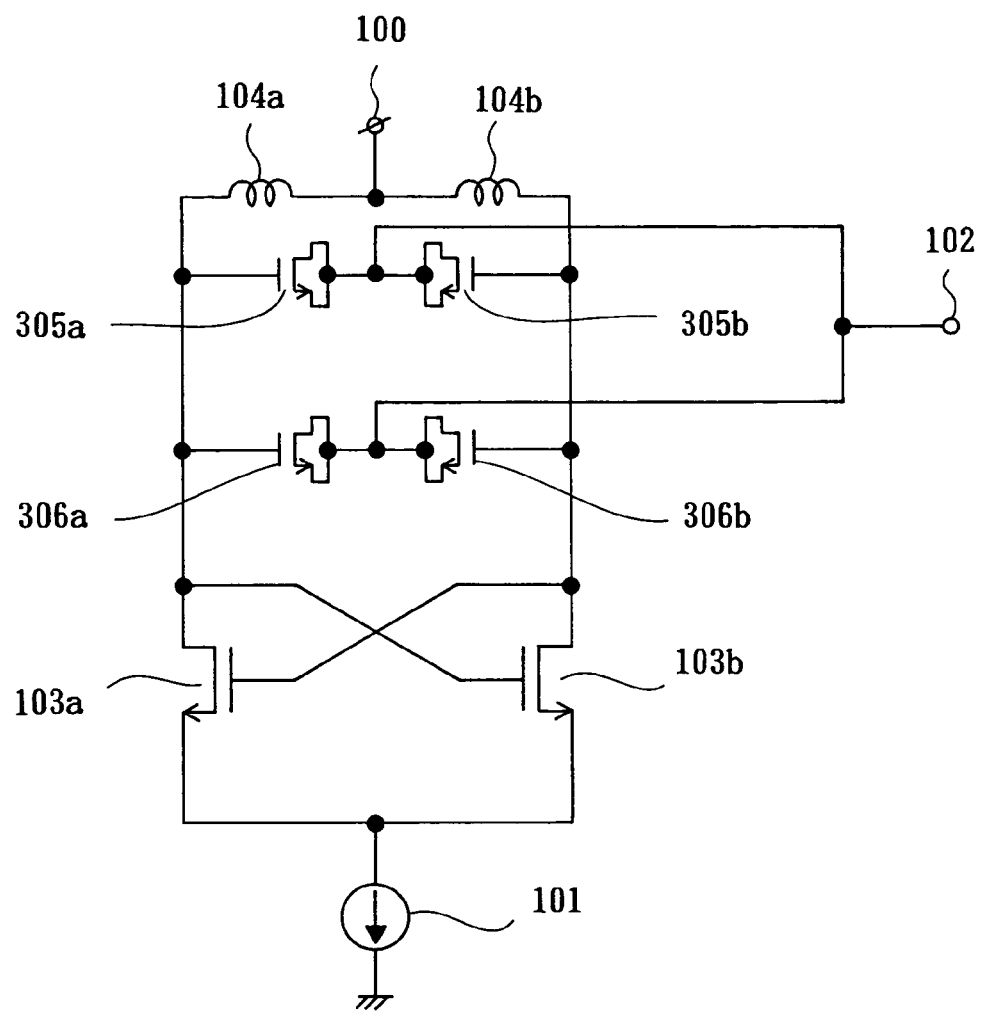
FIG. 17 is a circuit diagram showing a configuration example of the voltage-controlled oscillator according to a third embodiment of the present invention.

FIG. 17 shows a configuration example of the voltage-controlled oscillator according to this embodiment. The components in common with the first and second embodiments are given the same reference numerals, and a description thereof will be omitted. The voltage-controlled oscillator shown in FIG. 17 has variable capacitance elements 305a and 305b series-connected to constitute the variable capacitance circuit A, and has variable capacitance elements 306a and 306b series-connected to constitute the variable capacitance circuit B. The gate sides of the variable capacitance elements 305a, 305b, 306a and 306b are connected to the power supply voltage side without involving the DC-cut capacitors 110a and 110b. The reference voltage generation means 114 is not used in this embodiment.

Figure 18:
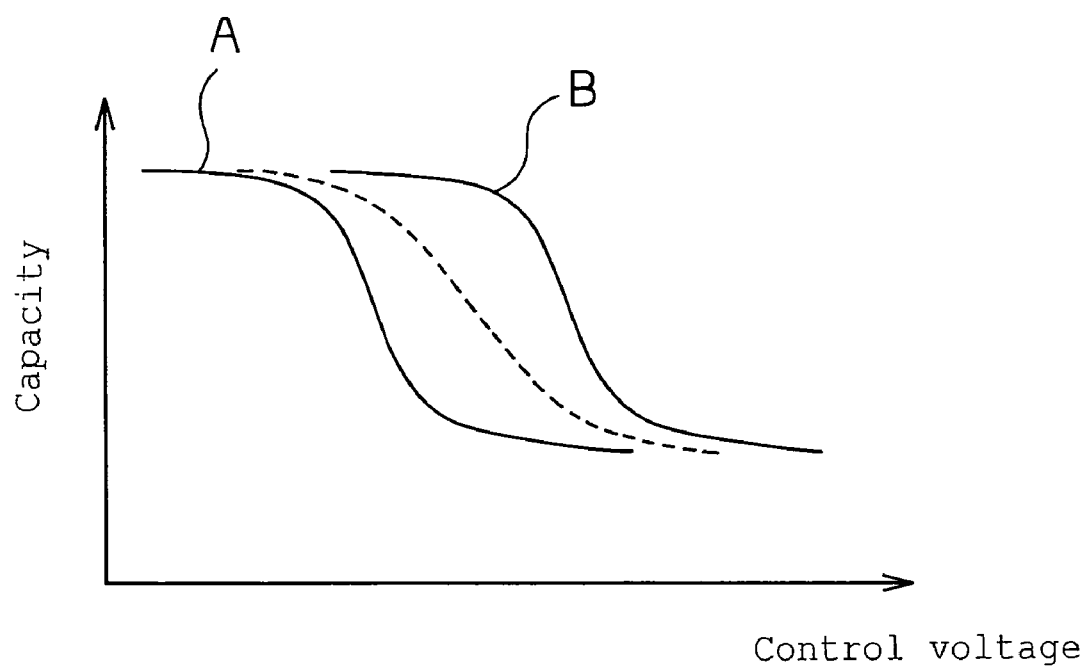
FIG. 18 is a diagram for explaining the principle of operation of the voltage-controlled oscillator according to the third embodiment of the present invention.

In the circuit shown in FIG. 17, the variable capacitance elements used in the variable capacitance circuit A and those used in the variable capacitance circuit B have different characteristics against the voltage. FIG. 18 illustrates such a difference in the characteristics. For instance, a curve A shown in FIG. 18 indicates the characteristic of the variable capacitance elements 305a and 305b used in the variable capacitance circuit A, and a curve B indicates the characteristic of the variable capacitance elements 306a and 306b used in the variable capacitance circuit B. Such a difference in the characteristics of the variable capacitance elements can be realized, for instance, by differentiating impurity concentrations of the wells of the variable capacitance elements.

As shown in FIG. 17, the variable capacitance circuits A and B are connected in parallel so that the characteristic of the entire circuit becomes moderate as indicated by the broken line in FIG. 18. Therefore, the voltage-controlled oscillator according to this embodiment has the effect of curbing phase noise as with the voltage-controlled oscillator according to the first embodiment.

Figure 19:
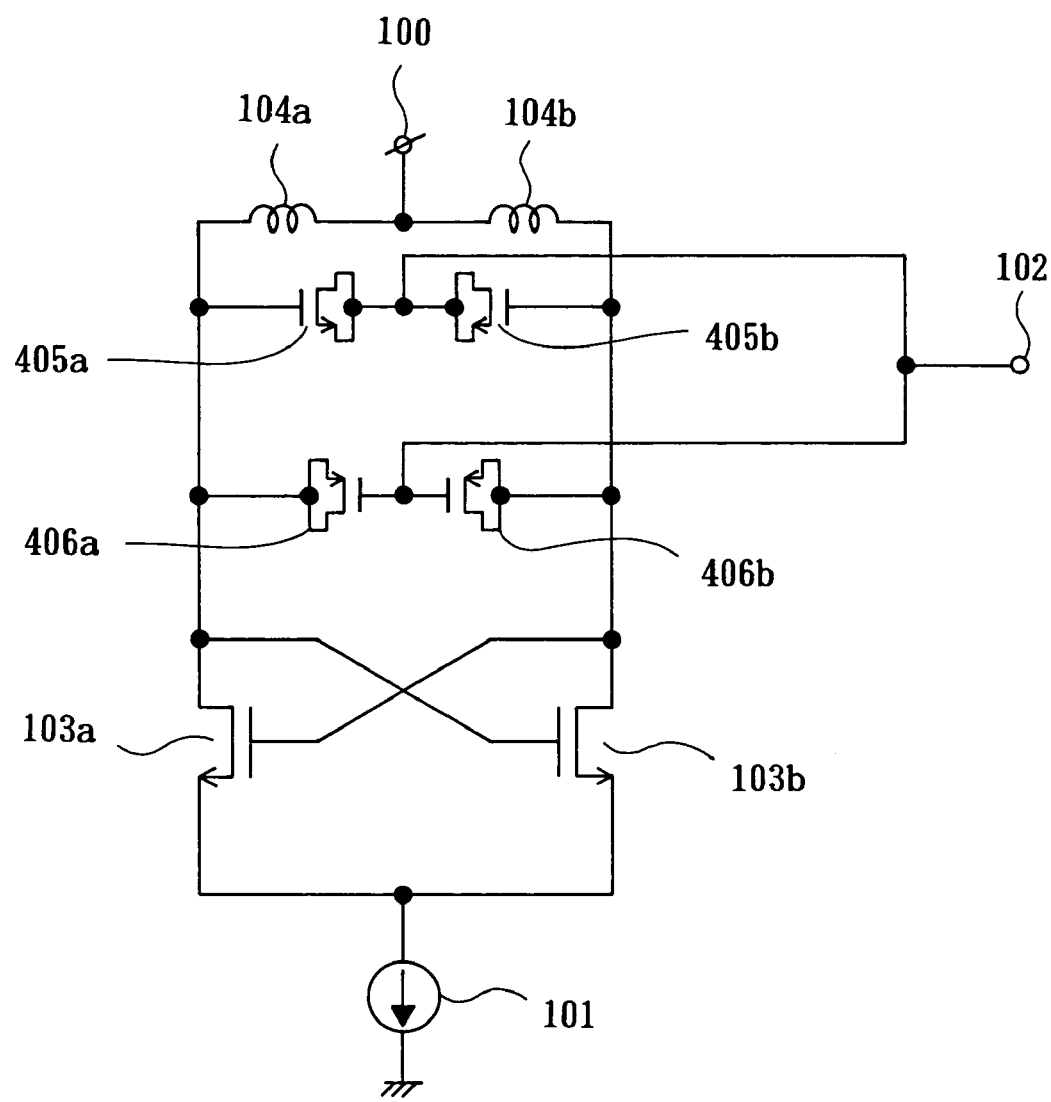
FIG. 19 is a circuit diagram showing a configuration example of the voltage-controlled oscillator according to the third embodiment of the present invention.

FIG. 19 shows a configuration example in the case where variable capacitance elements 405a and 405b utilizing an n-channel MOS are used in the variable capacitance circuit A and variable capacitance elements 406a and 406b utilizing a p-channel MOS are used in the variable capacitance circuit B (reversal thereof is also possible). As the characteristic of the capacitance against the voltage is reverse between the n-channel MOS and the p-channel MOS, the variable capacitance elements are connected in reverse directions in the variable capacitance circuits A and B respectively as shown in FIG. 19 (the variable capacitance elements 405a and 406a for instance). The same effect as described above can be obtained in such a configuration.

Figure 20:
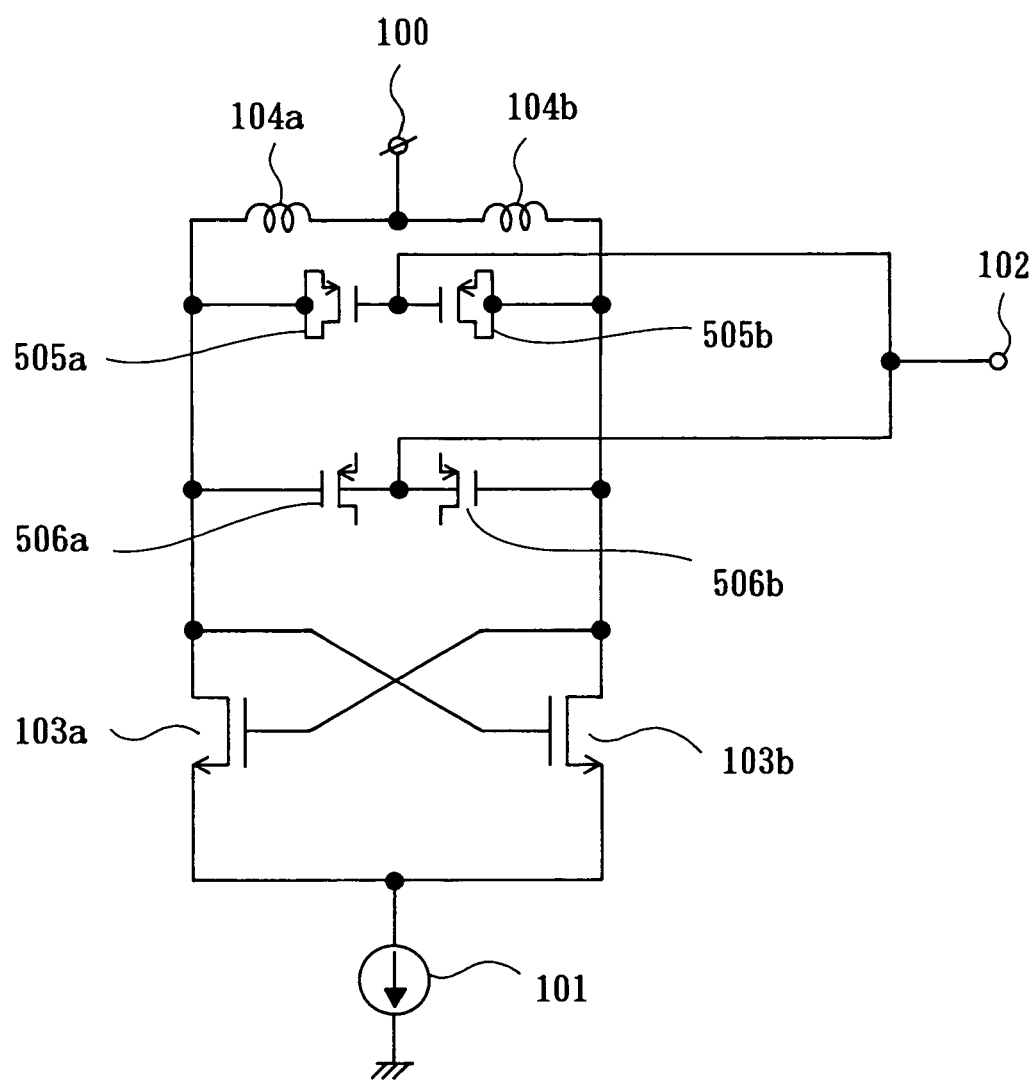
FIG. 20 is a circuit diagram showing a configuration example of the voltage-controlled oscillator according to the third embodiment of the present invention.
Figure 21:
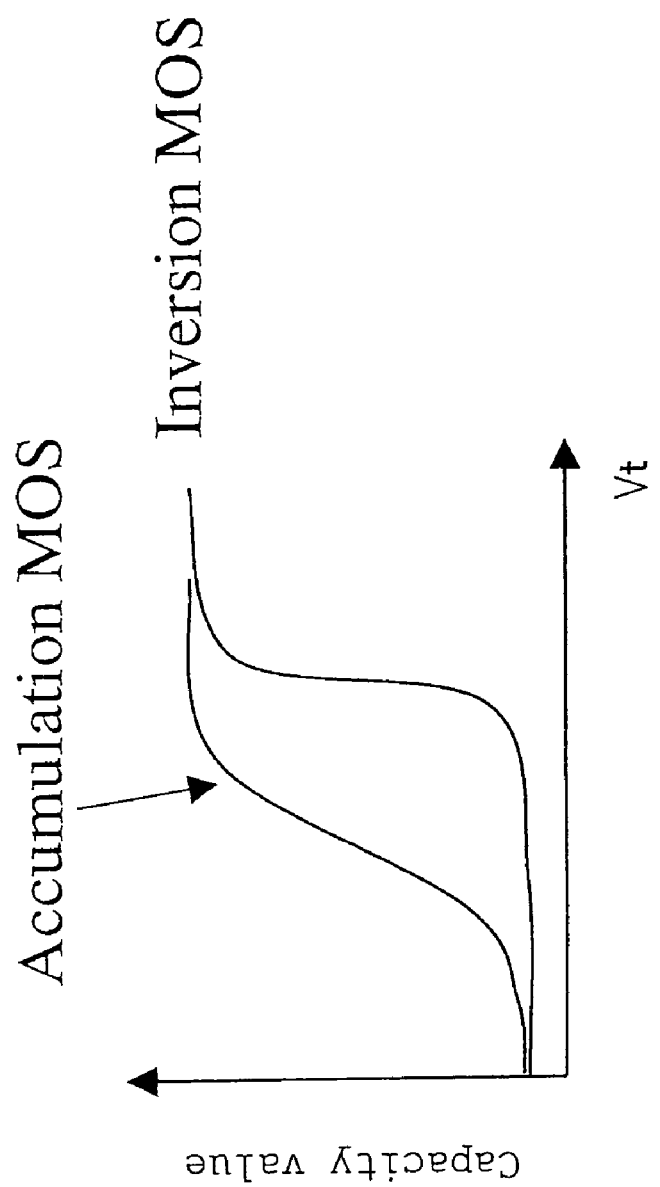
FIG. 21 is a diagram for explaining the principle of operation of the voltage-controlled oscillator according to the third embodiment of the present invention.
Figure 22:
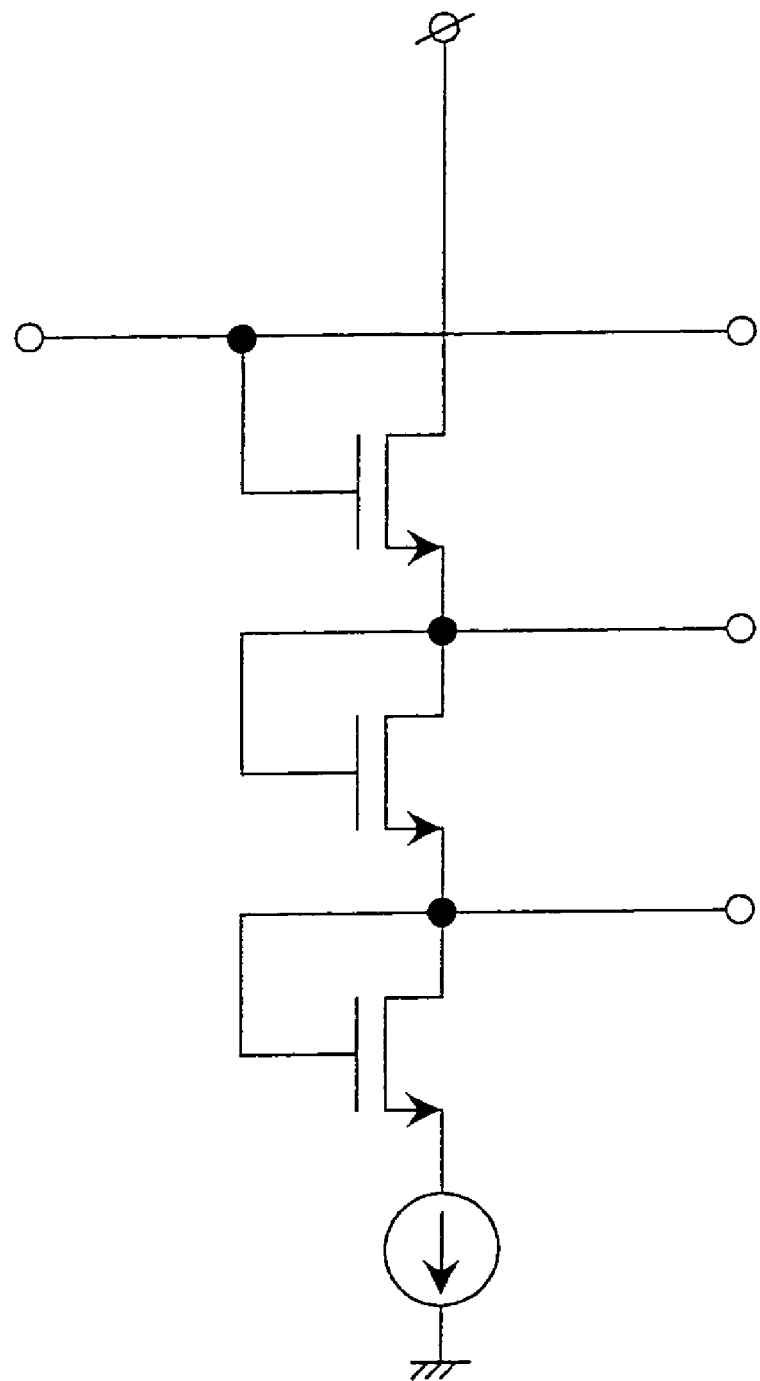
FIG. 22 is a diagram showing the configuration of a level shift circuit of the voltage-controlled oscillator in the past.

FIG. 20 shows a configuration example in the case where variable capacitance elements 505a and 505b utilizing an inversion MOS of having the capacitance formed between the gate and the drain-source are used as the variable capacitance elements in the variable capacitance circuit A, and variable capacitance elements 506a and 506b utilizing an accumulation MOS of having the capacitance formed between the gate and the well are used as the variable capacitance elements in the variable capacitance circuit B (reversal thereof is also possible). As the characteristic of capacitance against the voltage is reverse between the inversion MOS and the accumulation MOS, the variable capacitance elements are connected in reverse directions respectively as shown in FIG. 20 (the variable capacitance elements 505a and 506a for instance). Because of such a configuration, the characteristic of the entire circuit as to the capacitance against the voltage becomes more moderate as indicated by the broken line in FIG. 21 so that the same effect as described above can be obtained.

According to this embodiment, the examples have been described by using two variable capacitance circuits. However, it may be the configuration having the variable capacitance circuits further connected thereto. In that case, it may be the configuration wherein the characteristics of the variable capacitance elements in each variable capacitance circuit are different or may also be the configuration wherein the characteristics of the variable capacitance elements in at least two variable capacitance circuits are different. Even in such a case, the same effect as described above can be obtained if the characteristic of the entire circuit as to the capacitance against the voltage becomes more moderate.

It is also thinkable that the variable capacitance circuits shown in FIGS. 17 to 20 are combined. Even in such a case, the same effect as described above can be obtained if the characteristic of the entire circuit as to the capacitance against the voltage becomes more moderate.

According to the above description, MOS transistors are used as the oscillation transistors. However, bipolar transistors may also be used.

The scope of the present invention also includes a radio communication apparatus having the voltage-controlled oscillator according to the first and second embodiments and also having a PLL circuit of outputting the signal of a target frequency.

As described above, it is possible, according to the present invention, to moderate the change in the oscillation frequency against the control voltage of the voltage-controlled oscillator even in the case of using the variable capacitance elements of low linearity. Therefore, it is possible to maintain constant transient response characteristic and noise band characteristic of the PLL circuit over a wide band and connect a large-capacitance bypass capacitor in parallel to the signal output from the reference voltage generation means so as to realize the oscillator of a good phase noise characteristic.

Figure 16:
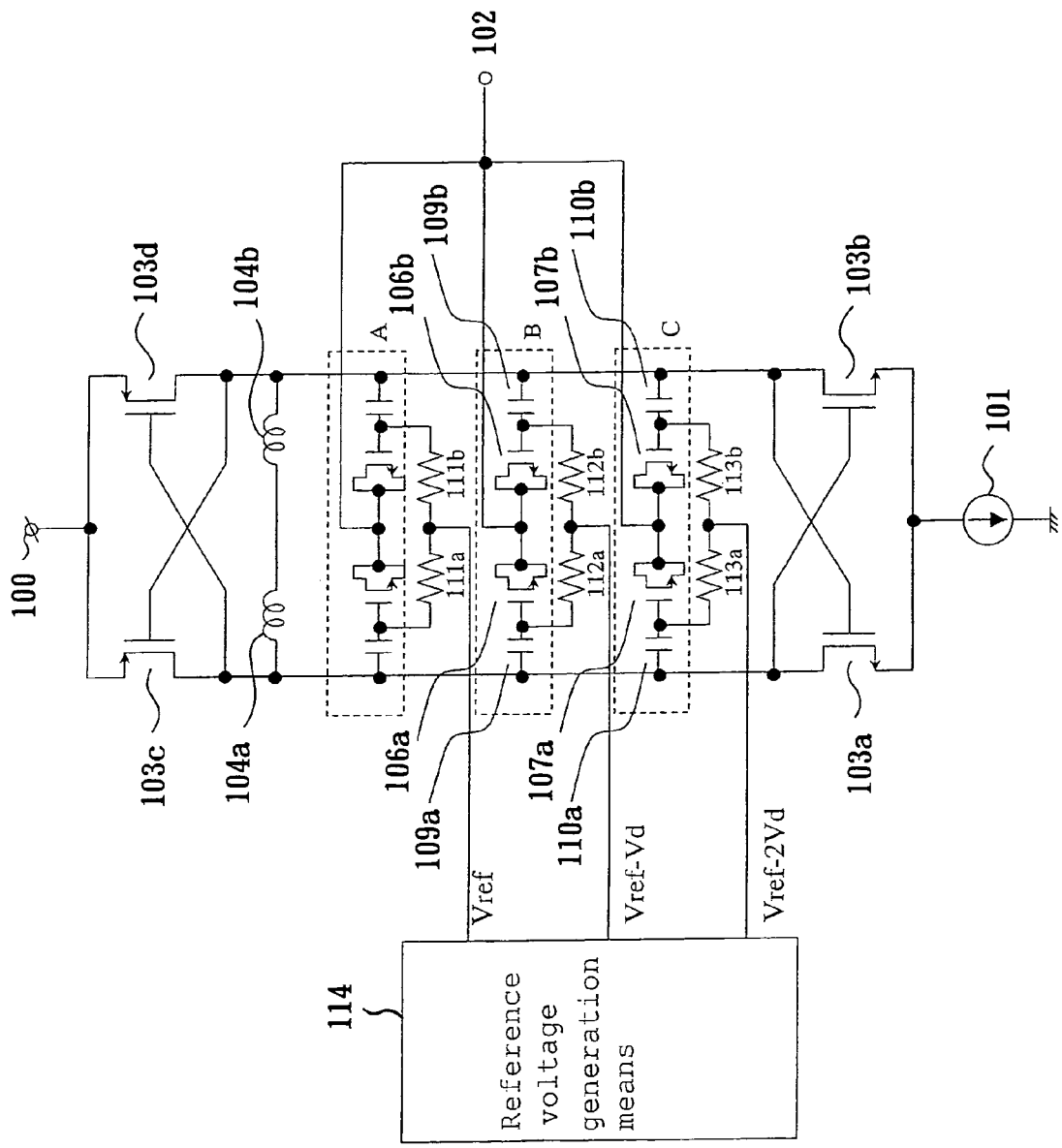
FIG. 16 is a circuit diagram showing another configuration example of the voltage-controlled oscillator according to the first embodiment of the present invention.

According to the above description, the power source terminal 100 is connected to the connection point of the inductors 104a and 104b. However, it is not limited thereto, and the configuration shown in FIG. 16 is also thinkable.

The voltage-controlled oscillator and voltage-controlled oscillation method according to the present invention can curb the influence of variation or the noise in the power supply voltage or curb degradation of the phase noise characteristic so that they are useful for the radio communication apparatus and so on.

What is claimed is:

1. A voltage-controlled oscillator comprising:
    an inductor circuit having an inductor;
    n pieces (n is two or more) of variable capacitance circuit having a variable capacitance element and having blocking capacitors of interrupting a direct current at both ends thereof, said n pieces of variable capacitance circuit including first, second and third variable capacitance circuits,
    a negative resistance circuit, and
    reference voltage generation means having m pieces of resistance connected in series between a power supply voltate and a grounding potential wherein:
    m is at least two;
    said inductor circuit, said n pieces of variable capacitance circuit, and said negative resistance circuit are connected in parallel;
    said reference voltage generation means dividing the power supply voltage by use of said m pieces of resistance to supply m pieces of reference voltage to one terminal of the variable capacitance elements of said n pieces of variable capacitance circuit from m pieces of connecting point between adjacent resistances of said m pieces of resistance;
    a control voltage of feedback-controlling an oscillation frequency is inputted to the other terminals of the variable capacitance elements of said n pieces of variable capacitance circuits;
    said n pieces of variable capacitance circuit are connected in parallel with each other so that each capacitance variation characteristic against said control voltage inputted to said variable capacitance circuit has the same-directed characteristic;
    said control voltage inputted to the other terminals of the variable capacitance elements of said n pieces of variable capacitance circuit is the same voltage;
    in said reference voltage generation means, a first resistance and a second resistance connected successively are configured so that a first reference voltage is supplied from a connection point positioned between said first resistance and said power supply voltage, a second reference voltage is supplied from the connection point between said first resistance and said second resistance, a third reference voltage is supplied from a connection point positioned between said second resistance and said grounding potential, and the resistance values of said first resistance and said second resistance are different than each other,
    of said n pieces of variable capacitance circuits, said first reference voltage is inputted to one of the terminals of said first variable capacitance circuit, said second reference voltage is inputted to one of the terminals of said second variable capacitance circuit, and said third reference voltage is inputted to one of the terminals of said second variable capacitance circuit;
    said first reference voltage, said second reference voltage, and said third reference voltage are fixed and respectively; and
    a first difference between said first reference voltage and said second reference voltage and a second difference between said second reference voltage and said third reference voltage are each different than each other wherein the linearity of a resonant frequency characteristic of the voltage-controlled oscillator is improved.

2. A voltage-controlled oscillator according to claim 1, further having connected in parallel thereto a frequency band setting variable capacitance circuit having a variable capacitance element, having a power supply voltage inputted to one terminal of said variable capacitance element and having a voltage according to a frequency band to be used of a plurality of voltages inputted to the other terminal of said variable capacitance element so as to change a capacitance of said variable capacitance element, wherein, when the capacitance of the variable capacitance element of said first variable capacitance circuit becomes less than a predetermined value, a variable range is reduced as to the capacitance of at least one variable capacitance circuit of said n pieces of variable capacitance circuit.

3. The voltage-controlled oscillator according to claim 2, wherein at least one variable capacitance circuit of said n pieces of variable capacitance circuit has the variable capacitance element connected in parallel to said variable capacitance element, and the voltage according to a frequency to be used of said plurality of voltages is inputted to the other terminal of one of said variable capacitance elements instead of said control voltage so that the variable range is reduced as to the capacitance of at least one variable capacitance circuit of said n pieces of variable capacitance circuit according to the reduction in the capacitance of the variable capacitance element of said frequency band setting variable capacitance circuit.

4. The voltage-controlled oscillator according to claim 2, wherein said blocking capacitor is comprised of two or more capacitors connected via a switch, and said switch is off or on according to the frequency to be used so that the capacitance of said blocking capacitors is reduced and a variable range of the capacitance of at least one of said n pieces of variable capacitance circuit is reduced.

5. The voltage-controlled oscillator according to claim 1, wherein at least one of said first variable capacitance circuit, said second variable capacitance circuit, and said third variable capacitance circuit is an accumulation MOS.

6. A radio communication apparatus having a PLL circuit of outputting a signal of a target frequency, said PLL circuit having the voltage-controlled oscillator according to claim 1.

* * * * *